US006433361B1

(12) United States Patent
Zhang et al.

(10) Patent No.: US 6,433,361 B1
(45) Date of Patent: *Aug. 13, 2002

(54) SEMICONDUCTOR INTEGRATED CIRCUIT AND METHOD FOR FORMING THE SAME

(75) Inventors: Hongyong Zhang; Akira Takenouchi; Hideomi Suzawa, all of Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 08/999,703

(22) Filed: Feb. 5, 1997

Related U.S. Application Data

(63) Continuation of application No. 08/431,323, filed on Apr. 28, 1995, now abandoned.

(30) Foreign Application Priority Data

| Apr. 29, 1994 | (JP) | 6-114448 |
| May 26, 1994 | (JP) | 6-137986 |
| May 26, 1994 | (JP) | 6-137987 |

(51) Int. Cl.[7] .............................................. H01L 29/04
(52) U.S. Cl. ..................... 257/59; 257/69; 257/72; 257/351
(58) Field of Search .......................... 257/57, 59, 619, 257/72, 350, 351, 347, 66, 69

(56) References Cited

U.S. PATENT DOCUMENTS

| 3,859,716 A | 1/1975 | Tihanyi |
| 4,757,026 A | 7/1988 | Woo et al. |
| 4,876,213 A | 10/1989 | Pfiester |
| 5,182,620 A | 1/1993 | Shimada et al. |
| 5,266,823 A | 11/1993 | Noji et al. |
| 5,323,042 A | 6/1994 | Matsumoto |
| 5,334,870 A | * 8/1994 | Katada et al. ............ 257/408 |
| 5,359,206 A | 10/1994 | Yamamoto et al. |
| 5,359,219 A | * 10/1994 | Hwang ..................... 257/351 |
| 5,396,084 A | 3/1995 | Matsumoto |
| 5,403,772 A | * 4/1995 | Zhang et al. ................ 257/66 |
| 5,412,240 A | 5/1995 | Inoue et al. |
| 5,412,493 A | 5/1995 | Kunii et al. |
| 5,463,483 A | 10/1995 | Yamazaki |
| 5,473,184 A | 12/1995 | Murai |
| 5,485,819 A | * 1/1996 | Yamazaki et al. .......... 257/59 |
| 5,495,121 A | 2/1996 | Yamazaki et al. |
| 5,499,123 A | 3/1996 | Mikoshiba |
| 5,514,879 A | 5/1996 | Yamazaki |
| 5,563,427 A | 10/1996 | Yudasaka et al. |
| 5,608,251 A | 3/1997 | Konuma et al. |
| 5,620,905 A | 4/1997 | Konuma et al. |
| 5,627,084 A | 5/1997 | Yamazaki et al. |
| 5,650,636 A | 7/1997 | Takemura et al. |
| 5,686,328 A | 11/1997 | Zhang et al. |
| 5,712,495 A | * 1/1998 | Suzawa ..................... 257/51 |
| 5,736,750 A | 4/1998 | Yamazaki et al. |
| 5,739,549 A | 4/1998 | Takemura et al. |
| 5,767,930 A | 6/1998 | Kobayashi et al. |
| 5,804,471 A | 9/1998 | Yamazaki et al. |
| 5,856,689 A | 1/1999 | Suzawa |
| 5,939,731 A | 8/1999 | Yamazaki et al. |
| 5,962,872 A | 10/1999 | Zhang et al. |
| 5,998,841 A | 12/1999 | Suzawa |

FOREIGN PATENT DOCUMENTS

EP 604006 6/1994

* cited by examiner

*Primary Examiner*—Sara Crane
(74) *Attorney, Agent, or Firm*—Eric J. Robinson; Nixon Peabody LLP

(57) ABSTRACT

In forming a thin film transistor (TFT), a semiconductor region is formed on a glass substrate and then a gate electrode is formed on the semiconductor region through an gate insulating film. After the gate electrode and a gate electrode arrangement extended from the gate electrode is anodized, insulators each having approximately rectangular shape are formed on side surfaces of the gate electrode and the gate electrode arrangement. An interlayer insulator is formed on a whole surface, and then the second layer arrangement is formed on the interlayer insulator. In an overlap portion in which the second layer arrangement overlaps the gate electrode and the gate electrode arrangement, since the insulators is formed, a slope is small.

66 Claims, 14 Drawing Sheets

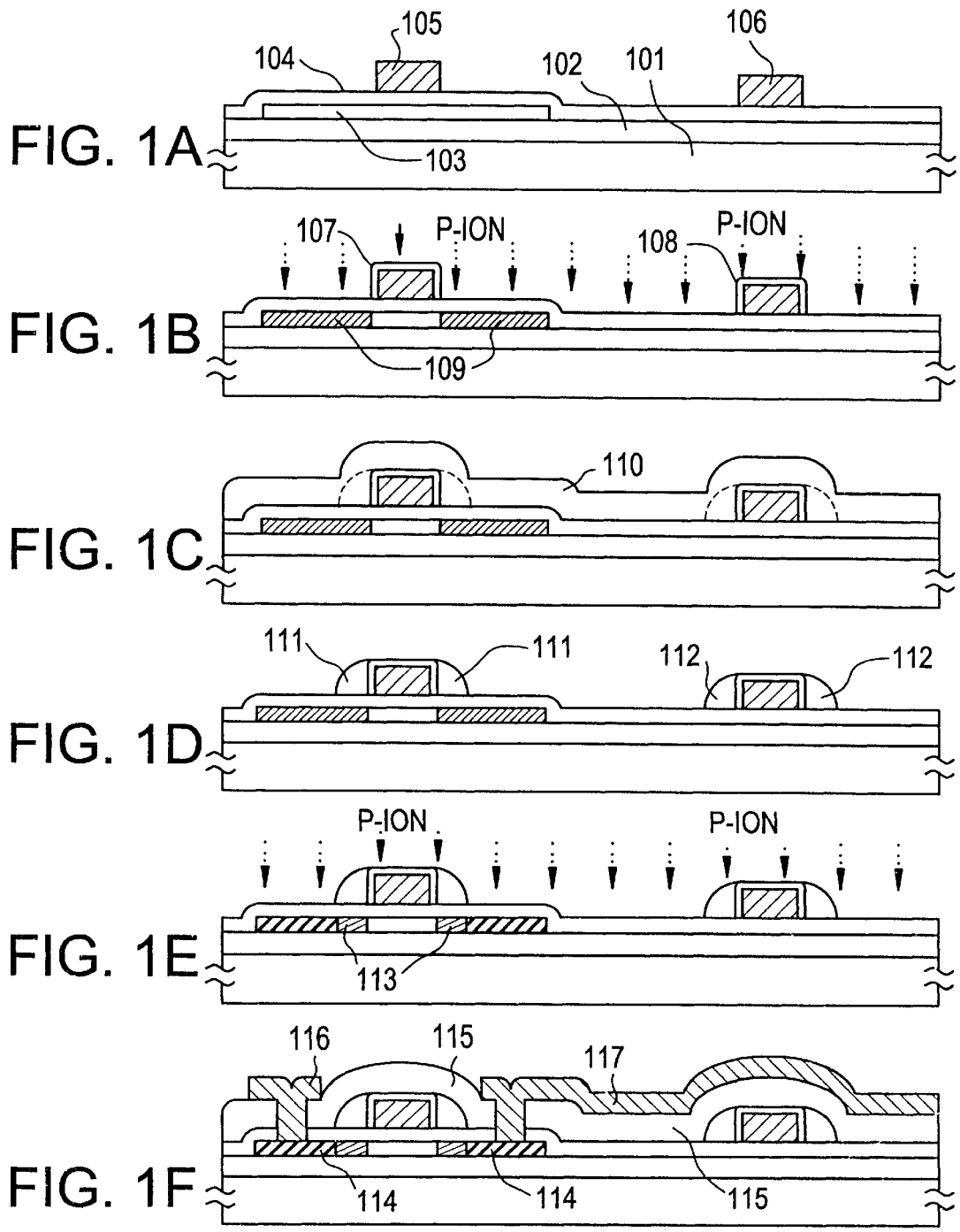

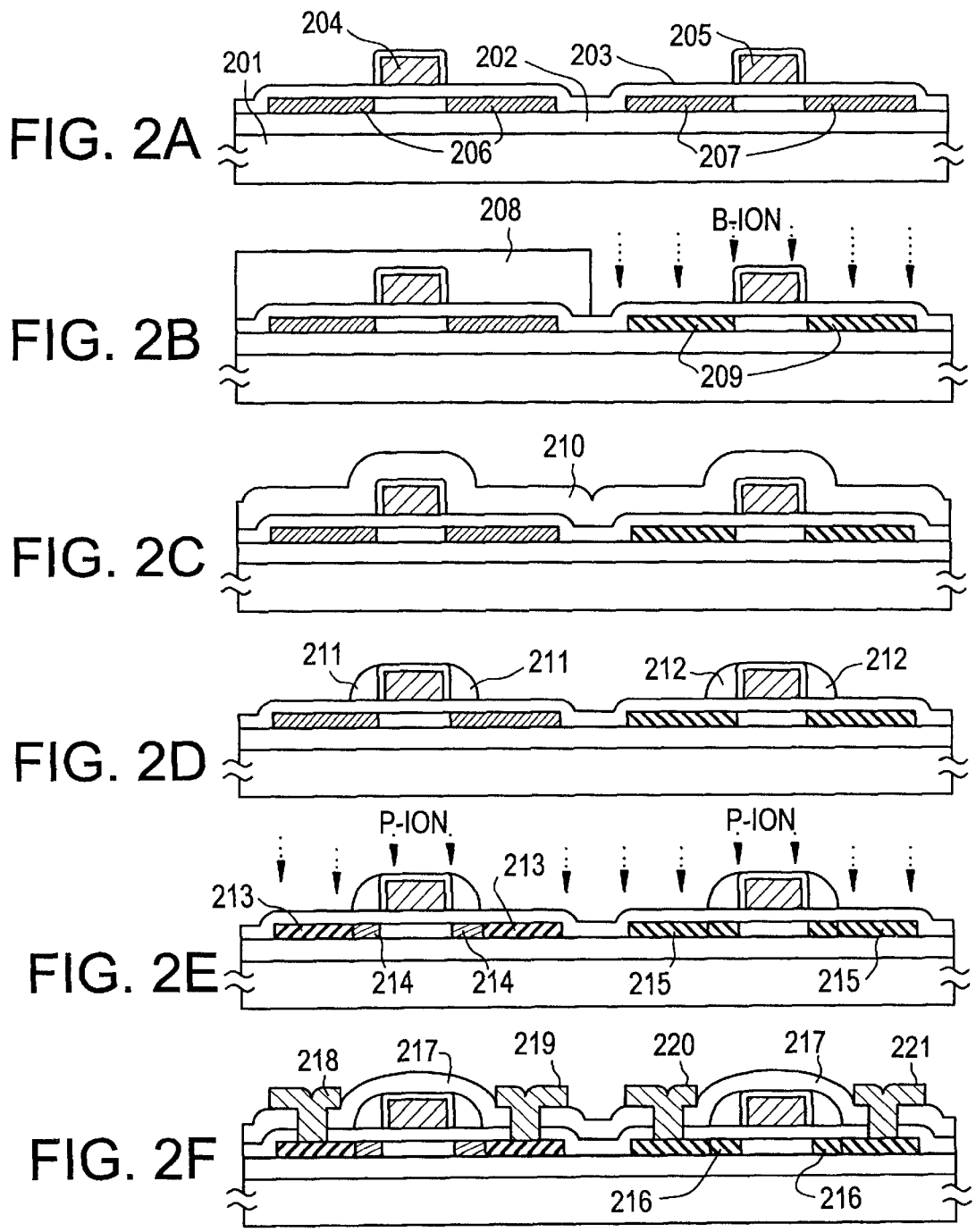

SEMICONDUCTOR INTEGRATED CIRCUIT AND METHOD FOR FORMING THE SAME

This application is a Continuation of Ser. No. 08/431,323, filed Apr. 28, 1995, now abandoned.

BACKGROUND OF THE INVENTION

The present invention relates to an integrated circuit in which a thin film insulated gate semiconductor device (thin film transistor, TFT) is formed on an insulating substrate and a method for the same. The insulating substrate represents an object having an insulating surface and includes an insulating material such as a glass and an object in which an insulator layer is formed on a material such as a semiconductor or a metal. In particular, the present invention relates to an integrated circuit using a material containing mainly a metal material such as aluminum, tantalum and titanium as a material of a gate electrode arrangement. A semiconductor integrated circuit of the present invention is used in an active matrix circuit and a peripheral driver circuit of a liquid crystal display or the like, a driver circuit of an image sensor or the like, an SOI integrated circuit, or a conventional semiconductor integrated circuit such as a microprocessor, a microcontroller, a microcomputer, or the a semiconductor memory.

In a case wherein an active matrix type liquid crystal display device, an image sensor or the like is formed on a glass substrate, a structure constructed by integrating thin film transistors (TFTS) is well known. In this structure, generally, after the first layer electrode arrangement (wiring) having a gate electrode is formed, an interlayer insulator is formed and then the second layer electrode arrangement is formed. If necessary, the third and fourth layer electrode arrangements are formed. In particular, in order to reduce a resistance of an arrangement, a metal material such as aluminum, tantalum and titanium is used as a material of each layer arrangement.

In an integrated circuit using TFTs, the second layer electrode arrangement is disconnected (broken) in an cross section portion (an overlap portion) of an electrode arrangement (gate wiring) extended from a gate electrode and the second layer electrode arrangement. This is because it is difficult to form an interlayer insulator on a gate electrode/arrangement with a superior step coverage and further planerize it. FIG. 4 shows a disconnection state in a conventional TFT integrated circuit. In FIG. 4, a TFT region 401 and a gate electrode arrangement 402 is formed on a substrate, and an interlayer insulator is formed to cover the TFT region 401 and the gate electrode arrangement 402. If the gate electrode arrangement 402 has a sharp edge, it cannot be sufficiently covered with the interlayer insulator 403. In this state, when a second layer electrode arrangements 404 and 405 are formed, the second layer electrode arrangement 405 is disconnected in an overlap portion 406.

In order to prevent such disconnection, it is necessary to increase a thickness of a second layer electrode arrangement (wiring). For example, it is desired that the thickness of the second layer electrode arrangement is about twice as thick as a thickness of a gate electrode arrangement. However, by increasing a thickness of the second layer electrode arrangement, a difference between a concave and a convex further increases in an integrated circuit. Also, when a further layer electrode arrangement is formed on the second layer electrode arrangement, a thickness of the second layer electrode arrangement must be determined in consideration of the disconnection. It is impossible to form a circuit in which an integrated circuit having an uneven surface is not desired, such as a liquid crystal display device, by increasing a thickness of the second layer electrode arrangement.

In an integrated circuit, if the disconnection occurs, since a whole circuit is defective, it is important to decrease the frequency of the disconnection.

SUMMARY OF THE INVENTION

The object of the present invention is to solve the above problems, that is, to decrease the frequency of the disconnection, thereby to increase a yield of an integrated circuit.

In the present invention, an oxide film is formed on at least upper surface of a gate electrode arrangement by oxidizing a gate electrode using anodization. Further, after insulators (side walls) having a substantially rectangular shape are formed on side surfaces of the gate electrode arrangement by anisotropy etching, an interlayer insulator is deposited and then the second layer electrode arrangement is formed. It is necessary not to etch easily the oxide film formed by anodization in comparison with a material constructing a side wall which is formed later. When side walls are formed using a silicon oxide, an aluminum oxide, a tantalum oxide, a molybdenum oxide, a tungsten oxide or the like is preferred. These material have an extremely low etching rate in a case wherein a silicon oxide is etched by dry etching using an etching gas including fluorine such as $NF_3$ and $SF_6$.

In a method of an embodiment according to the present invention, an island semiconductor layer is formed, and then a film is formed as a gate insulating film on the island semiconductor layer. Also, a gate electrode/arrangement are formed. It is required that the gate electrode/arrangement are formed using a material to be anodized and a film obtained by anodization is not etched easily in comparison with a side wall.

After that, the gate electrode/arrangement are immersed into an electrolytic solution having approximately neutral to apply a positive voltage to it, so that an anodic oxide film is formed on at least upper surface of the gate electrode/arrangement. This process may be performed by vapor phase anodization. This is the first stage.

An insulating film is formed to cover the gate electrode arrangement and the surrounding anodic oxide film. In this film formation, coverage is important. Also, it is suitable that a thickness of the insulating film is about ⅓ to 2 times as thick as a thickness (height) of a gate electrode/arrangement. It is preferred to use chemical vapor deposition (CVD) such as plasma CVD, low pressure CVD, atmosphere pressure CVD or the like. Such formed insulating film is etched by anisotropy etching in an approximately vertical direction to a substrate. In etching completion, although the insulating film in an even portion is etched, the gate insulating film formed under the insulating film may be etched. As a result, in a step portion (a difference in height) such as sides of the gate electrode/arrangement, since the insulating film is thick, insulators (side walls) having a substantially rectangular shape remain. This is the second stage.

After an interlayer insulator is formed, a contact hole is formed in at least one of source and drain regions of a TFT, and then a second layer electrode arrangement is formed. This is the third stage.

In the above stages, there is several cases for doping to form source and drain regions of a TFT. When only N-channel type TFT is formed on a substrate, an N-type impurity having a relatively high concentration may be introduced into a semiconductor layer using the gate electrode and the surrounding anodic oxide film as masks in a self-alignment in q process between the first and second stages. When an anodic oxide film is formed on side surfaces of the gate electrode, so-called offset gate type TFT in which the source and drain regions are spaced apart from the gate electrode by a thickness of the anodic oxide film is obtained. As described below, a normal TFT includes such TFT.

When an N-channel type TFT having a low concentration drain (lightly doped drain, LDD), an LDD type TFT is formed, after an impurity having a relatively low concentration is introduced into a semiconductor layer in a process between the first and second stages, an N-type impurity having a higher concentration is introduced in the semiconductor in a self-alignment using a gate electrode and side walls as masks. A width of an LDD region is approximately equal to that of the side walls. When only P-channel type TFT is formed, the above process may be performed.

Also, a complementary type circuit (CMOS circuit) having N-channel type and P-channel type TFTs can be formed by the above process. When both N-channel type and P-channel type TFTs are constructed by using a normal TFT or an LDD type TFT, an impurity introduction for forming only one of N-channel type and P-channel type TFTs may be used with respect to an N-type impurity and a P-type impurity.

When an N-channel type TFT necessary to prevent a hot carrier is formed as an LDD type TFT and a P-channel type TFT unnecessary to prevent a hot carrier is formed as a normal TFT, a special impurity introduction process is performed. In this process, an N-type impurity having a relatively low concentration is introduced into a semiconductor layer in a process between the first and second stages. This is the first impurity introduction. In this state, an N-type impurity may be introduced in a semiconductor layer of the P-channel type TFT.

Further, using the semiconductor layer of the N-channel type TFT as a mask, a P-type impurity having a high concentration is introduced into only the semiconductor layer of the P-channel type TFT. This is the second impurity introduction. Even though the N-type impurity is included in the semiconductor layer of the P-channel type TFT by the above N-type impurity introduction, since the P-type impurity having a higher concentration is introduced by the P-type impurity introduction, a conductivity type of a semiconductor is a P-type. A concentration of the impurity introduced by the second impurity introduction is higher than that of the impurity introduced by the first impurity introduction, by preferably 1 to 3 orders (digits).

Finally, in order to form the source and drain regions of the N-channel type TFT, an N-type impurity having a relatively high concentration is introduced in a process between the second and third stages. This is the third impurity introduction. In this state, the impurity introduction may be performed using a mask in order not to introduce the N-type impurity into the P-channel type TFT, or a mask may be not used. When the mask is used, it is required that a concentration of the N-type impurity to be introduced is lower than that of a P-type impurity introduced by the second impurity introduction, and the concentration of the N-type impurity is preferably 1/10 to 2/3 of that of the P-type impurity. As a result, the N-type impurity is also introduced into the P-channel type TFT. However, since the impurity concentration is lower than that of the P-type impurity, a P-type is maintained.

In the present invention, step coverage of an interlayer insulator in an overlap portion of gate electrode arrangements is improved by side walls, so that the frequency of disconnection of the second layer electrode arrangement can be decreased. Also, an LDD structure can be obtained using the side walls.

In the present invention, an anodic oxide film is important. In the second stage, anisotropy etching is performed to form side walls. However, since it is difficult to control a plasma in an insulating surface, variations of etching (depth) within a substrate produce. If the anodic oxide film is not formed on an upper surface of a gate electrode, the gate electrode may be etched largely (deeply) in a portion on the same substrate. On the other hand, if the anodic oxide film is formed, etching is stopped, so that the gate electrode is protected.

In the present invention, after the formation of a gate electrode/arrangement, an oxide film having a thickness of 1000 Å or more, preferably 1500 to 4000 Å is formed on at least upper surface (preferably, upper and side surface) of the gate electrode/arrangement by oxidizing the gate electrode/arrangement using anodization, and then a silicon nitride film is formed on upper and side surfaces of the oxide film by plasma CVD and sputtering. Further, after insulators (side walls) having a substantially rectangular shape are formed on side surfaces of the gate electrode arrangement by anisotropy-etching an insulator to be formed, an interlayer insulator is deposited and then the second layer electrode arrangement is formed. In a case wherein a silicon oxide as a material constructing side walls is etched by dry etching, since an etching rate of a silicon nitride is small, the silicon nitride can be used as an etching stopper.

When a silicon nitride film and a silicon oxide film are formed, it is necessary to use 200° C. or higher, in particular, 300° C. or higher (in a silicon nitride film). When a material such as aluminum, tantalum, titanium is used as a gate electrode/arrangement, since an uneven portion (hillock) produces on a surface at such temperature, this causes a short circuit in an interlayer. If a desired impurity is introduced into the metal material, production of the hillock can not be prevented completely. In order to prevent completely the production of the hillock, it is preferred that a surface is covered with an anodic oxide film having a thickness of 1000 Å or more. Therefore, the gate electrode/arrangement is oxidized by the above anodization to form an oxide film on a surface of the gate electrode/arrangement.

In a method of an embodiment according to the present invention, an island semiconductor layer is formed, and then a film is formed as a gate insulating film on the island semiconductor layer. Also, a gate electrode/arrangement are formed. It is required that the gate electrode/arrangement are formed using a material to be anodized.

After that, the gate electrode/arrangement are immersed into an electrolytic solution having approximately neutral to apply a positive voltage to it, so that an anodic oxide film is formed on at least upper surface of the gate electrode/arrangement. This process may be performed by vapor phase anodization.

A silicon nitride film having a thickness of 100 to 2000 Å, preferably 200 to 1000 Å, is formed. The film formation may be performed by another CVD, sputtering or the like. This is the first state.

An insulating film is formed on the silicon nitride film. In this film formation, coverage is important. Also, it is suitable that a thickness of the insulating film is about 1/3 to 2 times as thick as a thickness (height) of a gate electrode/arrangement. It is preferred to use chemical vapor deposition (CVD) such as plasma CVD, low pressure CVD, atmosphere pressure CVD or the like. Such formed insulating film is etched by anisotropy etching in an approximately vertical direction to a substrate. In etching completion, although a surface of the silicon nitride film is etched, the gate electrode and the gate insulating film which are formed under the silicon nitride film is not etched. As a result, in a step portion (a difference in height) such as sides of the gate electrode/arrangement, since the insulating film is thick, insulators (side walls) having a substantially rectangular shape remain. This is the second stage.

After an interlayer insulator is formed, a contact hole is formed in at least one of source and drain regions of a TFT, and then a second layer electrode arrangement is formed. This is the third stage.

After side walls are formed in the second stage, a silicon nitride film may be etched by dry etching. It is further preferred to perform this etching while observing through an end point monitor. In the etching process of the silicon nitride film, etching is controlled accurately by using the monitor and a thickness of the silicon nitride film to be etched is 100 to 2000 Å. Therefore, even though overetching is performed, an etching depth is very shallower than that of the gate electrode and the gate insulating film, so that no influence is provided substantially with the gate electrode and the gate insulating film. Further, since the anodic oxide film is formed under the silicon nitride film, the gate electrode is protected.

As described above, a method for etching a silicon nitride film is effective in a case wherein a material of a gate insulating film is the same material as an interlayer insulator and the material is not a silicon nitride. That is, when the interlayer insulator is formed after etching the silicon nitride film, etching can be performed at one stage in formation of contact holes.

In the above stages, there is several cases for doping to form source and drain regions of a TFT. When only N-channel type TFT is formed on a substrate, an N-type impurity having a relatively high concentration may be introduced into a semiconductor layer using the gate electrode as a mask in a self-alignment in a process between the first and second stages. When an anodic oxide film is formed on side surfaces of the gate electrode, so-called offset gate type TFT in which the source and drain regions are spaced apart from the gate electrode by a thickness of the anodic oxide film is obtained. As described below, a normal TFT includes such TFT.

When an N-channel type TFT having a low concentration drain (lightly doped drain, LDD), an LDD type TFT is formed, after an impurity having a relatively low concentration is introduced into a semiconductor layer in a process between the first and second stages, an N-type impurity having a higher concentration is introduced in the semiconductor in a self-alignment using a gate electrode and side walls as masks. A width of an LDD region is approximately equal to that of the side walls. When only P-channel type TFT is formed, the above process may be performed.

When an offset type TFT is formed, an impurity may be introduced into a semiconductor layer using a gate electrode and side walls as masks in a self-alignment in a process between the second and third stages. In this state, a width of an offset is approximately equal to that of the side walls. In a TFT having such structure, a width of a substantially intrinsic region which becomes a channel forming region is approximately equal to summation of a width of the gate electrode and widths of side walls formed on the side surfaces of the gate electrode.

Also, a complementary type circuit (CMOS circuit) having N-channel type and P-channel type TFTs can be formed by the above process. When both N-channel type and P-channel type TFTs are constructed by using a normal TFT or an LDD type TFT, an impurity introduction for forming only one of N-channel type and P-channel type TFTs may be used with respect to an N-type impurity and a P-type impurity.

When an N-channel type TFT necessary to prevent a hot carrier is formed as an LDD type TFT and a P-channel type TFT unnecessary to prevent a hot carrier is formed as a normal TFT, a special impurity introduction process is performed. In this process, an N-type impurity having a relatively low concentration is introduced into a semiconductor layer in a process between the first and second stages. This is the first impurity introduction. In this state, an N-type impurity may be introduced in a semiconductor layer of the P-channel type TFT.

Further, using the semiconductor layer of the N-channel type TFT as a mask, a P-type impurity having a high concentration is introduced into only the semiconductor layer of the P-channel type TFT. This is the second impurity introduction. Even though the N-type impurity is included in the semiconductor layer of the P-channel type TFT by the above N-type impurity introduction, since the P-type impurity having a higher concentration is introduced by the P-type impurity introduction, a conductivity type of a semiconductor is a P-type. A concentration of the impurity introduced by the second impurity introduction is higher than that of the impurity introduced by the first impurity introduction, by preferably 1 to 3 orders (digits).

Finally, in order to form the source and drain regions of the N-channel type TFT, an N-type impurity having a relatively high concentration is introduced in a process between the second and third stages. This is the third impurity introduction. In this state, the impurity introduction may be performed using a mask in order not to introduce the N-type impurity into the P-channel type TFT, or a mask may be not used. When the mask is used, it is required that a concentration of the N-type impurity to be introduced is lower than that of a P-type impurity introduced by the second impurity introduction, and the concentration of the N-type impurity is preferably $1/10$ to $2/3$ of that of the P-type impurity. As a result, the N-type impurity is also introduced into the P-channel type TFT. However, since the impurity concentration is lower than that of the P-type impurity, a P-type is maintained.

In the present invention, step coverage of an interlayer insulator in an overlap portion of gate electrode arrangements is improved by side walls, so that the frequency of disconnection of the second layer electrode arrangement can be decreased. Also, an LDD structure and an offset region can be obtained using the side walls.

In the present invention, a silicon nitride film is important. In the second stage, anisotropy etching is performed to form side walls. However, since it is difficult to control a plasma in an insulating surface, variations of etching (depth) within a substrate produce. Since an etching depth is $1/3$ to 2 times of a height (thickness) of a gate electrode/arrangement, the variations are influenced largely. If the silicon nitride film is not formed on an upper surface of a gate electrode, the gate electrode and the gate insulating film may be etched largely (deeply) in a portion on the same substrate in a side wall etching process. On the other hand, if the silicon nitride film is formed in the side wall etching process, etching is stopped, so that the gate electrode and the gate insulating film are protected. After that, when the silicon nitride film is removed by dry etching, an etching depth of the silicon nitride film is extremely smaller (shallower) that of the side walls, so that gate electrode and the gate insulating film may be overetched. However, influence is not large. Also, even though overetching is performed, the gate electrode is protected completely by the anodic oxide film.

BRIEF DESCRIPTION OF THE DRAWINGS

FIGS. 1A to 1F show a forming process of a TFT circuit according to a first embodiment of the present invention;

FIGS. 2A and 2F show a forming process of a TFT circuit according to a second embodiment;

DETAILED DESCRIPTION OF THE PREFERRED EMBODIMENTS

[Embodiment 1]

Figure 3A:
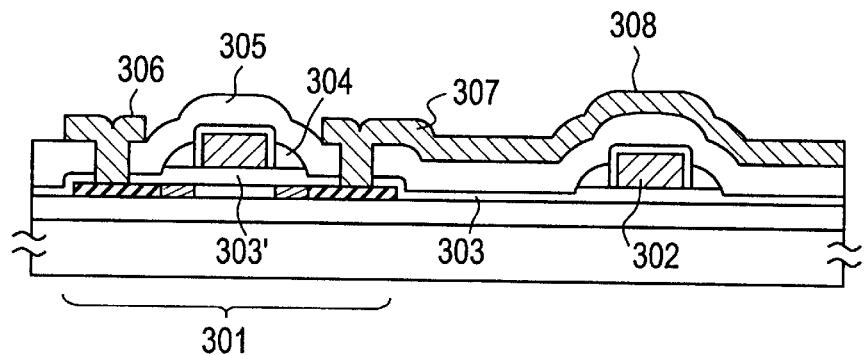
FIGS. 3A and 3B show a forming process of a TFT circuit according to a third embodiment.

FIGS. 1A to 1F show a first embodiment. A silicon oxide film having a thickness of 1000 to 1500 Å, for example, 1200 Å, is formed as a base oxide film 102 on a substrate (Corning 7059, a size of 300 mm×400 mm or 100 mm×100 mm) 101 by sputtering in an oxygen atmosphere. To improve mass productivity, the oxide film may be formed by decomposing and depositing a TEOS using plasma CVD. Such formed silicon oxide film may be annealed at 400 to 650° C.

An amorphous silicon film having a thickness of 300 to 5000 Å, preferably 400 to 1000 Å, for example, 500 Å is deposited by plasma CVD and low pressure CVD (LPCVD), and then is placed in a reduced atmosphere at 550 to 600° C. for 8 to 24 hours, to crystallize it. In this state, crystallization may be promoted by adding a metal element such as nickel which promotes crystallization, at an extremely small quantity. This process may be performed by laser irradiation. The crystallized silicon film is etched to form an island region 103. Further, a silicon oxide film 104 having a thickness of 700 to 1500 Å, for example, 1200 Å is formed on the silicon film by plasma CVD.

An aluminum (including Si of 1 weight % or Sc (scandium) of 0.1 to 0.3 weight %) film having a thickness of 1000 Å to 3 μm, for example, 5000 Å, is formed by sputtering and then etched to form a gate electrode 105 and a gate electrode arrangement (wiring) 106. (FIG. 1A)

Anodization is performed by supplying a current to the gate electrode 105 and the gate electrode arrangement 106 in an electrolytic solution, so that anodic oxides 107 and 108 each having a thickness of 500 to 2500 Å, for example, 2000 Å, are formed. The electrolytic solution is obtained by diluting an ethylene glycol with L-tartaric acid at a concentration of 5% and by adjusting it at 7.0±0.2 pH using ammonia. The substrate is immersed into the electrolytic solution. A positive (+) side terminal of a constant current source is connected with the gate electrode arrangement on the substrate and a negative (−) side terminal of the constant current source is connected with a platinum electrode, and then a voltage is applied in a constant current state. Oxidization is continued until the applied voltage reaches 150 V. Further, oxidization is continued until a current reaches 0.1 mA or less while applying 150 V in a constant voltage state with 20 mA. As a result, an aluminum oxide film having a thickness of 2000 Å is obtained.

By ion doping, an impurity (phosphorus, P) is implanted into the island silicon film 103 using a gate electrode portion (a gate electrode and a surrounding anodic oxide film) as a mask in a self-alignment, to form low concentration impurity regions (LDDs) 109 as shown in FIG. 1B. A dose is $1\times10^{13}$ to $5\times10^{14}$ atoms/cm$^2$, for example, $5\times10^{13}$ atoms/cm$^2$. An accelerating voltage is 10 to 90 kV, for example, 80 kV. (FIG. 1B).

By plasma CVD, a silicon oxide film 110 is deposited. Raw gases are TEOS and oxygen, or monosilane and nitrous oxide. A suitable thickness of the silicon oxide film 110 is changed by a height (thickness) of a gate electrode arrangement. When a height of the gate electrode/arrangement including an anodic oxide film is about 6000 Å, the suitable thickness is preferably 2000 Å to 1.2 μm which is ⅓ to 2 times the height of the gate electrode/arrangement, 6000 Å in the embodiment. In this film formation, it is necessary to obtain not only uniformity of a film thickness in an even portion but also superior step coverage. As a result, a thickness of a silicon oxide film formed on a side surface portion of the gate electrode/arrangement is thick by a portion as shown in a dotted line of FIG. 1C. (FIG. 1C)

By anisotropy etching using a well known reactive ion etching (RIE), the silicon oxide film 110 is etched. This etching is completed when etching reaches the gate insulating film 104. The etching stop timing can be controlled by lowering an etching rate of the gate insulating film 104 than that of the silicon oxide film 110. By the above process, insulators (side walls) 111 and 112 each having a approximately rectangular shape remain in side surfaces of the gate electrode/arrangement. (FIG. 1D)

By ion doping, phosphorous (P) is introduced. It is preferred that a dose is larger 1 to 3 orders (figures) than that in the process of FIG. 1B. In the embodiment, the dose is 40 times the dose of first phosphorus doping, that is, $2\times10^{15}$ atoms/cm$^2$. An accelerating voltage is 80 kV. As a result, regions (source/drain) 114 into which phosphorus is introduced at a high concentration are formed. Also, low concentration regions (LDDs) 113 remain under the side walls. (FIG. 1E)

A KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$. In the embodiment, since aluminum is used in a gate electrode/arrangement, there is a problem in heat resistance. Instead of laser irradiation, thermal annealing may be performed.

A silicon oxide film having a thickness of 5000 Å is formed as an interlayer insulator 115 on a whole surface by CVD. Contact holes are formed in source and drain regions of a TFT, and then an aluminum arrangement 116 and an aluminum electrode 117 in the second layer are formed. A thickness of the aluminum arrangement is approximately equal to the gate electrode/arrangement, and 4000 to 6000 Å.

By the above process, an N-channel type TFT having LDDs are completed. In order to activate impurity regions, hydrogen annealing may be further performed at 200 to 400° C. Since a step in an overlap portion which the second layer arrangement 117 overlaps the gate arrangement 106 has a small sloop by the side walls 112, although a thickness of the second layer arrangement is approximately (nearly) equal to a gate electrode/arrangement, disconnection in a step is not almost observed. (FIG. 1F) With respect to a thickness of the second layer arrangement, when a thickness of a gate electrode/arrangement is x (Å) and a thickness of the second layer arrangement is y (Å), if y≧x−1000 (Å), a remarkably disconnection is not observed in an experiment by the inventors. The smaller value y is preferred. In particular, in a circuit which it is necessary to even (smooth) a surface of a substrate, such as an active matrix circuit of a liquid crystal display device, it is desired that x−1000 (Å)≦y≦x+1000 (Å).

[Embodiment 2]

FIGS. 2A to 2F show a second embodiment. The embodiment relates to a nomolithic type active matrix circuit in which an active matrix circuit and a driver circuit are formed simultaneously on the same substrate. In the embodiment, a switching element of an active matrix circuit has a P-channel type TFT, and a driver circuit has a complementary type circuit constructed by N-channel type and P-channel type TFTs. In figures, an N-channel type TFT used in a driver circuit is shown in a left side and a P-channel type TFT used in the driver circuit and an active matrix circuit is shown in a right side. A P-channel type TFT is used as a switching element of an active matrix circuit because a leak current (off current) is small.

As similar to Embodiment 1, a silicon oxide film is formed as a base oxide film 202 on a substrate (Corning 7059) 201. Island silicon semiconductor regions are deposited and then silicon oxide film 203 is formed as a gate insulating film on the silicon regions. An aluminum film having a thickness of 5000 Å is formed to obtain gate electrodes 204 and 205. After that, as similar to Embodiment 1, anodization is performed to form anodic oxides each having a thickness of 2000 Å around each gate electrode (in upper and side surfaces of each gate electrode). By ion doping, phosphorus (P) is implanted using a gate electrode portion as a mask, to form low concentration Ntype impurity regions 206 and 207. A dose is $1 \times 10^{13}$ atoms/cm$^2$.

A KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$. (FIG. 2A)

After an N-channel type TFT is masked by a photoresist 208, boron (B) having a high concentration is doped by ion doping. A dose is $5 \times 10^{15}$ atoms/cm$^2$. An accelerating voltage is 65 kV. As a result, the impurity regions 207 which becomes a weak N-type by a previous phosphorous doping becomes P-type impurity regions 209 by inverting into an intense P-type. After that, the impurity is activated by laser irradiation again. (FIG. 2B)

In the embodiment, a partial selective doping with a high concentration boron is performed after a whole doping with a low concentration phosphorus. However, a whole doping with a low concentration phosphorus may be performed after a partial selective doping with a high concentration boron.

After the photoresist 208 as a mask is removed, a silicon oxide film 210 having a thickness of 4000 to 8000 Å is deposited by plasma CVD. (FIG. 2C)

As similar to Embodiment 1, by anisotropy etching, side walls 211 and 212 of a silicon oxide are formed on side surfaces of the gate electrodes. (FIG. 2D)

By ion doping, phosphorous (P) is introduced again. It is preferred that a dose is larger 1 to 3 orders (figures) than that in the process of FIG. 2A and ⅒ to ⅔ of the dose in the process of FIG. 2B. In the embodiment, the dose is 200 times the dose of first phosphorus doping, that is, $2 \times 10^{15}$ atoms/cm$^2$. This dose is 40% of the dose of boron in the process of FIG. 2B. An accelerating voltage is 80 kV. As a result, regions (source/drain) 213 into which phosphorus is introduced at a high concentration are formed. Also, low concentration regions (LDDs) 214 remain under the side walls. (FIG. 2E)

A KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$.

Although phosphorous is also doped in a p-channel type TFT (right side in a figure), since a concentration of previously doped boron is 2.5 times that of phosphorus, a P-type is maintained. Although it appears that P-type regions of the P-channel type TFT include regions 216 formed under the side walls and regions 215 formed outside the regions 216 (in positions opposite to a channel forming regions), a remarkably difference between them on electrical characteristics does not appear. (FIG. 2E)

As shown in FIG. 2F, a silicon oxide film having a thickness of 3000 Å is formed as an interlayer insulator 217 on a whole surface by CVD. Contact holes are formed in source and drain regions of a TFT, and then aluminum electrode arrangements 218, 219, 220 and 221 are formed. By the above process, a semiconductor integrated circuit using an N-channel type TFT having LDDs are completed.

Although not shown in figures, an interlayer insulator is not so thick in an overlap portion in which the second layer arrangement overlaps a gate electrode/arrangement. However, as similar to Embodiment 1, disconnection is not almost appeared.

In order to prevent deterioration of a TFT by a hot carrier, in the embodiment, an N-channel type TFT has LDD structures. However, LDD regions correspond to parasitic resistors serial-connected to source and drain regions, an operation speed of the TFT is reduced. Therefore, it is desired that a TFT does not include LDD regions in a P-channel type TFT which a mobility is small and deterioration by a hot carrier is less.

In the embodiment, when a doping process is performed, the doped impurity is activated by laser irradiation. However, after all doping processes are completed and immediately before an interlayer insulator is formed, doping processes may be performed.

[Embodiment 3]

Figure 3B:
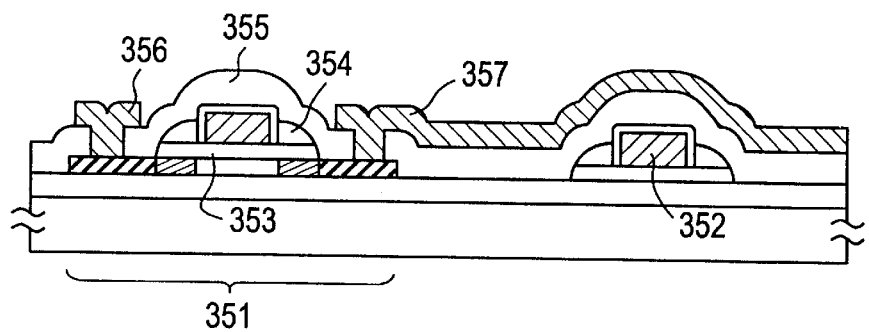
Figure 4:
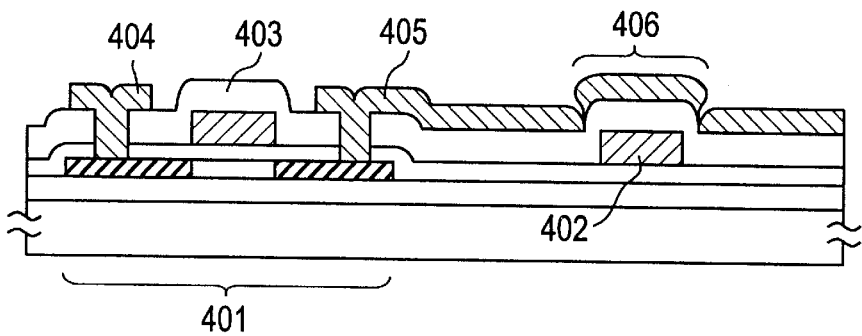
FIG. 4 shows a conventional forming process of a TFT circuit.

FIGS. 3A and 3B show a third embodiment. The embodiment shows several etchings for forming side walls in Embodiment 1. In FIG. 3A, a TFT region 301 and a gate electrode arrangement 302 are shown. The forming process is the same as Embodiment 1 with FIGS. 1A to 1F.

In the embodiment, since etching with overetching is performed in an anisotropy etching process for forming side walls 304, the side walls are positioned somewhat under an upper surface of a gate electrode/arrangement. Also, etching is performed until it reaches a gate insulating film 303.

In the embodiment, an etching rate of a material constructing the side walls is twice that of the gate insulating film 303. Therefore, even though the same etching condition is set, a depth which the gate insulating film is etched is a half that of the side walls. A thickness of the gate insulating film becomes a half of an original thickness by etching. On the other hand, thicknesses of the side walls 304 and an gate insulating film 303' formed under the a gate electrode/arrangement is the same as an original thickness. Also, since the gate electrode/arrangement is covered with an anodic oxide, it is not almost damaged in an anisotropy etching for forming side walls.

In this state, an interlayer insulator 305 is formed on a whole surface. Though the side walls 304 are formed in a lower position than Embodiment 1, since a step around the vicinity of the gate electrode/arrangement has a gently slope, in comparison with a conventional case, the interlayer insulator covers an overlap portion 308 of a gate electrode/arrangement sufficiently. After that, the second layer arrangements 306 and 307 are formed. However, since undulation of the interlayer insulator 305 in the overlap portion 308, disconnection in the overlap portion 308 is not produced.

FIG. 3B shows a case wherein an etching rate of a material constructing side walls 354 is equal to that of a gate insulating film 353. Therefore, the gate insulating film and the side walls are etched in the same etching condition. In the embodiment, the gate insulating film is etched completely, so that an active layer of a TFT is exposed. In this state, undulation of an interlayer insulator 355 in an overlap portion, disconnection of second layer arrangements 356 and 357 in the overlap portion is not produced.

As shown in FIG. 3A, it is difficult to remain (etch) a gate insulating film having a half of an original thickness. Therefore, As shown in FIG. 1F or 3B, it is easy that a gate insulating film is not etched or the gate insulating film is etched completely.

[Embodiment 4]

Figure 6:
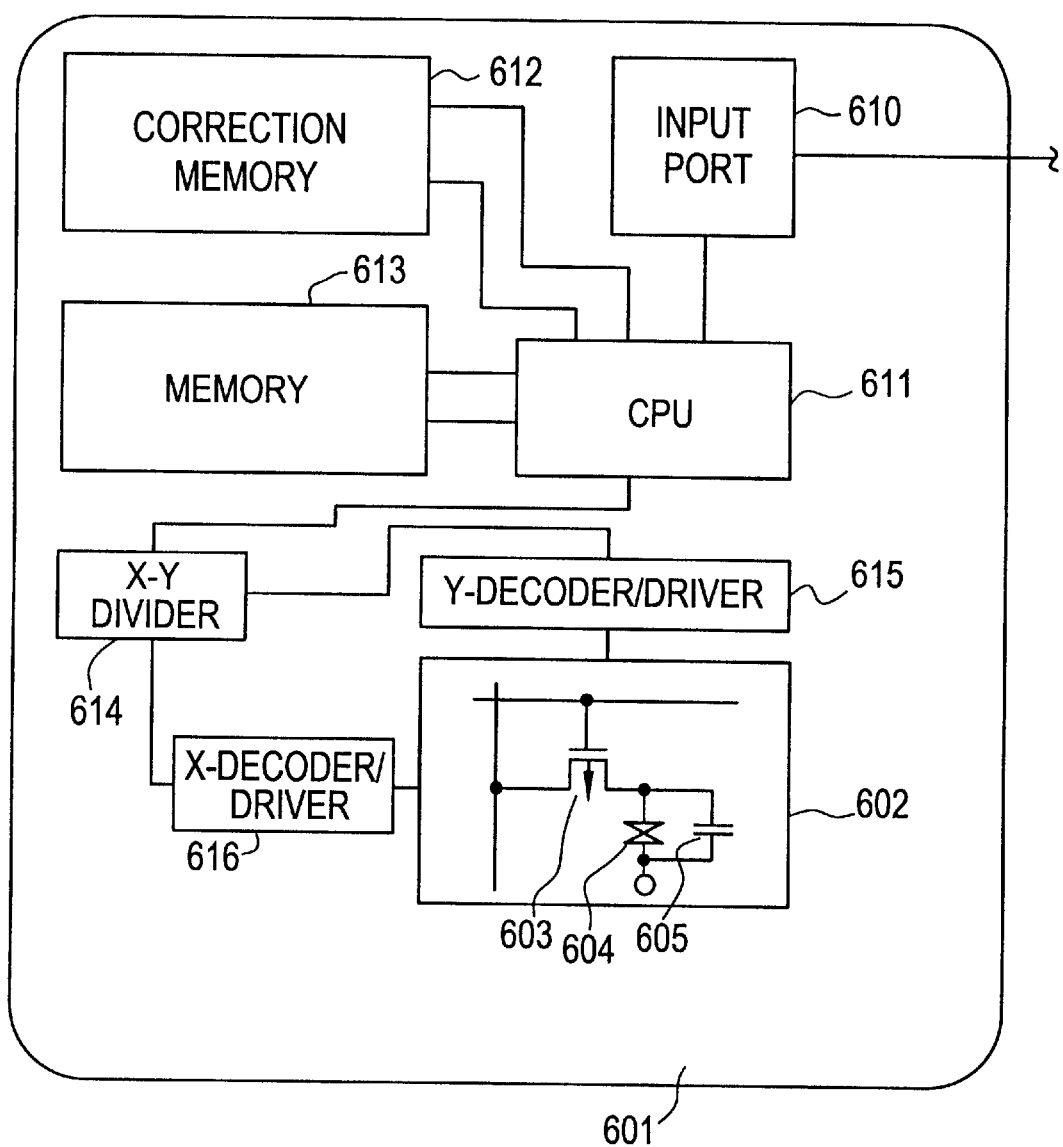
FIG. 6 shows a block diagram of the TFT circuit according to the fourth embodiment.

FIG. 6 shows a block diagram of a liquid crystal display device in which an active matrix circuit, a peripheral driver circuit, a circuit such as a central processing unit (CPU) and the like are formed on the same glass substrate. All TFTs constructing these circuits are formed on the same substrate 601. In FIG. 6, a liquid crystal display device includes an active matrix circuit 602, an input port 610, a CPU 611, a correction memory 612, a memory 613, an X-Y divider 614, a Y-decoder/driver 615, an X-decoder/driver 616. The active matrix circuit 602 has a TFT 603 arranged in one pixel, a pixel electrode 604 having a liquid crystal and an auxiliary capacitor 605.

The input port 610 receives a signal output from an external such as a computer system, and converts the received signal into an image signal. The correction memory 612 is used to correct an input signal in accordance with characteristics of an active matrix panel and is inherent to this panel. In particular, the correction memory 612 is an non-volatile memory and stores correction information inherent to each pixel. If a pixel has a point defect, correction signals are supplied to pixels around the pixel having a point defect, in order to cover a point defect and not to highlight a defect. If a pixel is darker than surrounding pixels, a signal having a higher level is supplied to the pixel, to coincide with brightness of the surrounding pixels.

The CPU 611 and the memory 613 each has the same function as a commonly-used computer. In particular, the memory 613 is an image memory for storing image data corresponding to each pixel, as a random access memory (RAM). A backlight unit (not shown) for irradiating a substrate with a light from the rear side can be controlled in accordance with image information.

Figure 5:
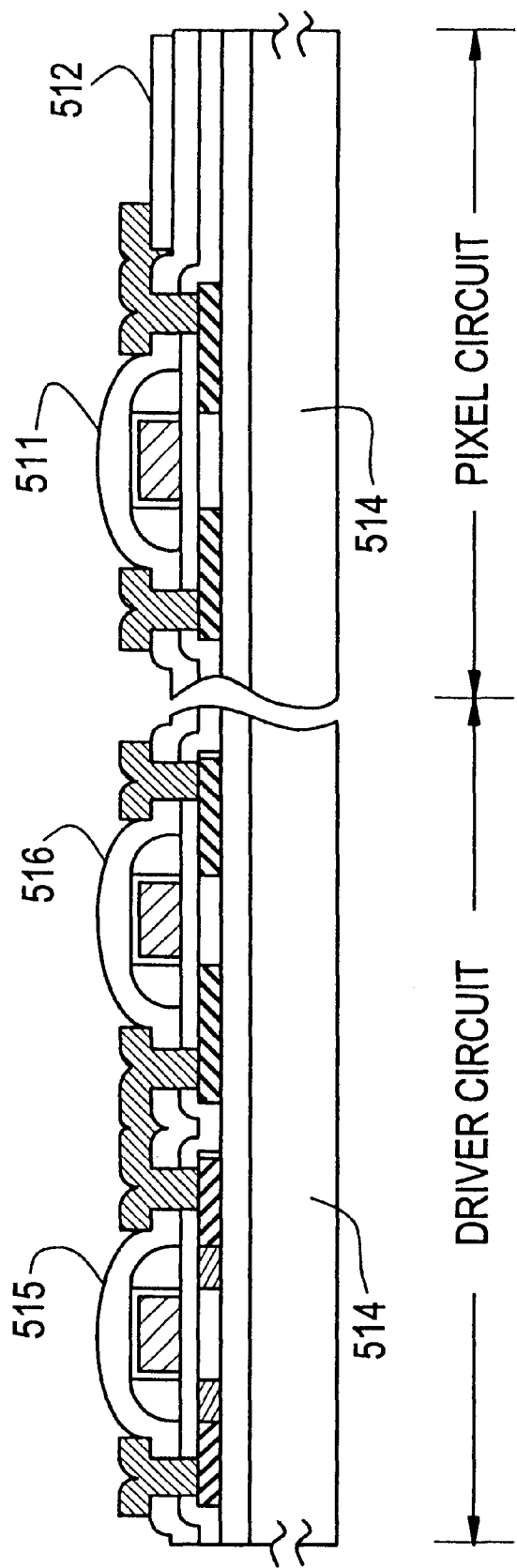
FIG. 5 shows a cross section view of a TFT circuit according to a fourth embodiment.

FIG. 5 shows a cross section of such circuit. The circuit includes an active matrix circuit (pixel circuit) region and a region which has a peripheral driver circuit, a CPU, a memory and the like, other than the active matrix circuit region. In the embodiment, a complementary type circuit which is constructed by an N-channel type TFT 515 and a P-channel type TFT 516 is used in the region other than the active matrix circuit region. A forming process is the same as Embodiment 2 with FIGS. 2A to 2F. In the active matrix circuit region, a P-channel type TFT 511 which is connected with a pixel electrode 512 is used. The TFT 511 and the TFT 516 are formed simultaneously.

[Embodiment 5]

FIG. 7 shows a fifth embodiment. In the embodiment, as similar to Embodiment 2, an N-channel type TFT having an LDD and a normal P-channel type TFT are formed on the same substrate. In FIG. 7, an N-channel type TFT is shown in a left side, a P-channel type TFT is shown in a right side.

A silicon oxide film is formed as a base oxide film 702 on a substrate (Corning 7059) 701. Island silicon semiconductor regions are formed and then a silicon oxide film 703 is formed as a gate insulating film on the silicon regions. An aluminum film (a thickness of 5000 Å) which a surface is covered with an anodic oxide is formed to obtain gate electrodes 704 and 705.

Figure 7A:
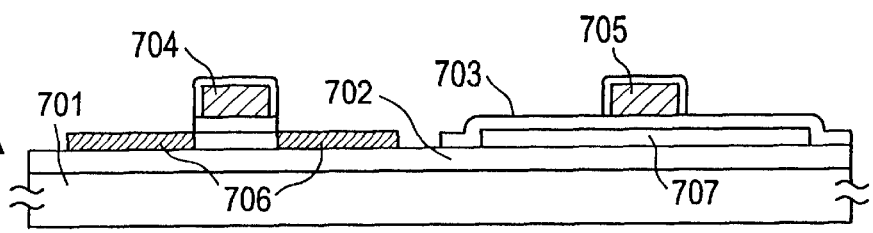
FIGS. 7A to 7F show a forming process of a TFT circuit according to a fifth embodiment.

The gate insulating film with respect to an N-channel type TFT is selectively etched using the gate electrode 704 as a mask, to expose the semiconductor regions. By ion doping, phosphorus is implanted using a gate electrode portion as a mask, to form a low concentration N-type impurity region 706. A dose is $1 \times 10^{13}$ atoms/cm$^2$. An accelerating voltage is 20 kV. In this process, since the accelerating voltage is low, phosphorus is not implanted into an island region 707 of a P-channel type TFT covered with the gate insulating film 703. (FIG. 7A)

Figure 7B:
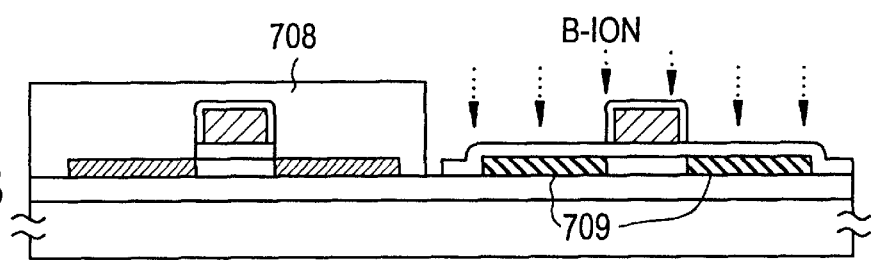

After the N-channel type TFT is masked by a photoresist 708, boron (B) having a high concentration is doped by ion doping. A dose is $5 \times 10^{14}$ atoms/cm$^2$. An accelerating voltage is 65 kV. As a result, a P-type impurity regions 709 is formed in the island region 707. (FIG. 7B)

In the embodiment, a partial selective doping with a high concentration boron is performed after a whole doping with a low concentration phosphorus. However, a whole doping with a low concentration phosphorus may be performed after a partial selective doping with a high concentration boron.

Figure 7C:
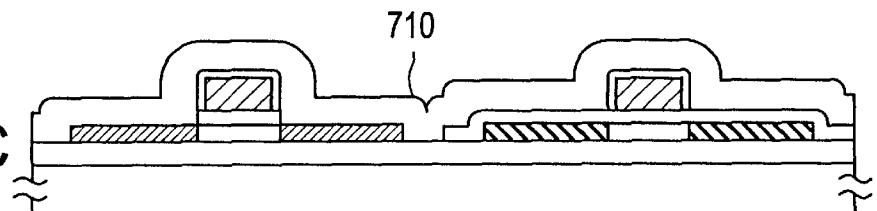

After the photoresist 708 as a mask is removed, a silicon oxide film 710 having a thickness of 4000 to 8000 Å is deposited by plasma CVD. (FIG. 7C)

Figure 7D:
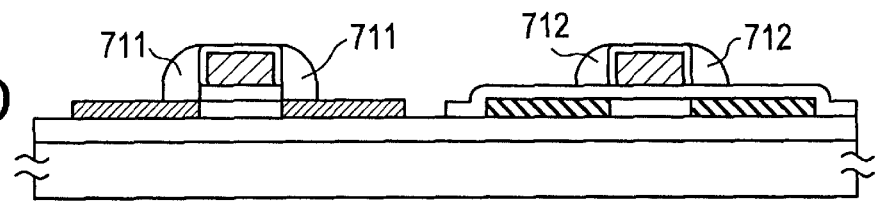

As similar to Embodiment 2, by anisotropy etching, side walls 711 and 712 of a silicon oxide are formed on side surfaces of the gate electrodes. (FIG. 7D)

By ion doping, phosphorous is introduced again. It is preferred that a dose is larger 1 to 3 orders (figures) than that in the process of FIG. 7A. In the embodiment, the dose is 200 times the dose of first phosphorus doping, that is, $2 \times 10^{15}$ atoms/cm$^2$. An accelerating voltage is 20 kV. As a result, regions (source/drain) 713 into which phosphorus is introduced at a high concentration are formed. Also, low concentration regions (LDDs) 714 remain under the side walls.

Figure 7E:
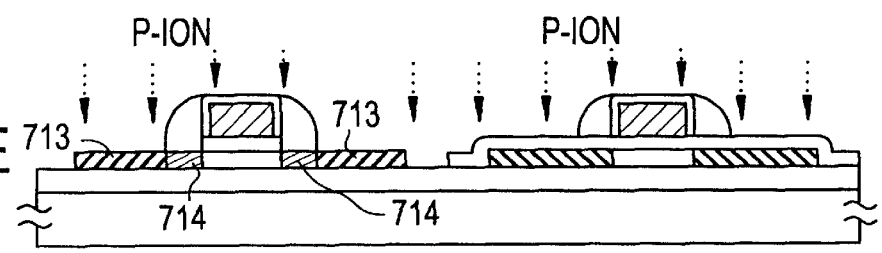

On the other hand, in the P-channel type TFT, since the gate insulating film is formed, phosphorus ion is not implanted. In Embodiment 2, since phosphorus and boron are implanted at a high concentration, a dose range is limited. In the embodiment, a dose range is not limited. However, it is desired that a dose of phosphorus is low and a dose of boron is high. (FIG. 7E)

After doping process, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$.

Figure 7F:
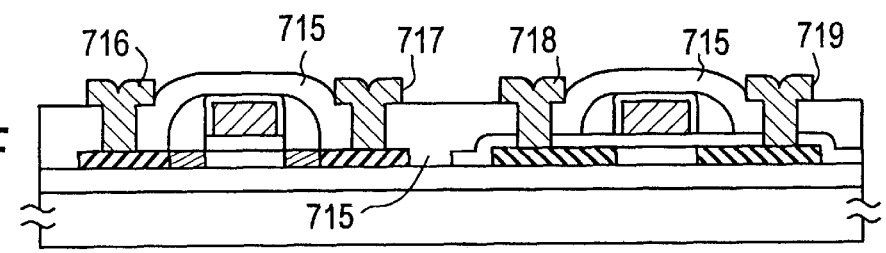

As shown in FIG. 7F, a silicon oxide film having a thickness of 5000 Å is formed as an interlayer insulator 715 on a whole surface by CVD. Contact holes are formed in source and drain regions of a TFT, and then aluminum electrode arrangements 716, 717, 718 and 719 are formed. By the above process, a semiconductor integrated circuit using an N-channel type TFT having LDDs are completed.

In the embodiment, in comparison with Embodiment 2, a photolithography process and an etching process are further performed to remove the gate oxide film of the N-channel type TFT. However, an N-type impurity is not introduced substantially into the P-channel type TFT, it is merit that a dose of N type and P-type impurities is can be changed easily.

Also, since phosphorus implanted into the vicinity of a surface of the gate insulating film 703 in the P-channel type TFT is used to form a glass containing phosphorus by a later laser irradiating process, it is effective in preventing entering of an active ion such as sodium.

[Embodiment 6]

Figure 8A:
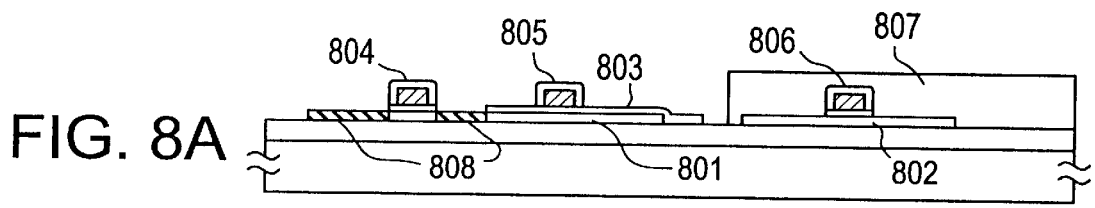
FIGS. 8A to 8G show a forming process of a TFT circuit according to a sixth embodiment.

FIGS. 8A to 2G show a sixth embodiment. The embodiment relates to a method for forming an active matrix type liquid crystal display device. In figures, an N-channel type TFT having an LDD (center portion) and a normal P-channel type TFT (left side) are logical circuits used in a driver circuit and the like, and a P-channel type TFT having an offset (right side) is a switching transistor used in an active matrix array.

A silicon oxide film is formed as a base oxide film on a substrate (Corning 7059). Island silicon semiconductor regions (an island region 801 for a peripheral circuit and an island region 802 for an active matrix circuit) are deposited and then silicon oxide film 803 is formed as a gate insulating film on the silicon regions. An aluminum film (a thickness of 5000 Å) which a surface is covered with an anodic oxide is formed to obtain gate electrodes 804 and 805 for a peripheral circuit and a gate electrode 806 for an active matrix circuit.

The gate insulating film of the P-channel type TFT for a peripheral circuit and an active matrix circuit is selectively removed using the gate electrodes 804 and 806 as masks to expose the semiconductor regions. An active matrix circuit region is masked by a photoresist 807 and then boron is implanted using a gate electrode portion as a mask by ion doping, to form high concentration P-type impurity regions 808. A dose is 1×10$^{15}$ atoms/cm$^2$, and an accelerating voltage is 20 keV. In this doping process, since an accelerating voltage is low, boron is not doped into the N-channel type TFT covered with the gate insulating film 803. (FIG. 8A)

After that, phosphorus is doped at a low concentration by ion doping. A dose is 1×10$^{13}$ atoms/cm$^2$, and an accelerating voltage is 80 kV. As a result, low concentration N-type impurity regions 809 are formed in the N-channel type TFT. (FIG. 8B)

Figure 8B:
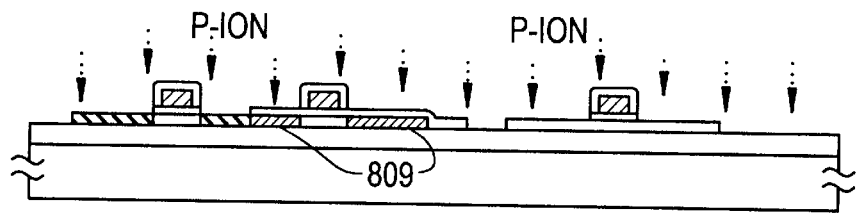

In FIG. 8B, doping is performed after the photoresist 806 as a mask is removed. Doping may be performed without removing the photoresist. Since an accelerating voltage with respect to phosphorus is high, when the doping is performed without removing the photoresist, phosphorus is not implanted into the active matrix circuit region. Therefore, an ideal P-channel type TFT having an offset is obtained. However, since the photoresist is ashed by doping, removing of the photoresist takes time in a case.

When the photoresist is removed, since an accelerating voltage with respect to phosphorus is high, a concentration peak of phosphorus produces under the island semiconductor regions. However, it cannot be assured that phosphorus is not doped completely into the island semiconductor regions, so that phosphorus having an extremely small quantity is introduced into the island semiconductor regions. Even though phosphorus is doped, a concentration of phosphorus is less. This is preferred in a TFT for an active matrix circuit which has P$^+$ (source)/n$^-$/I (channel)/n$^-$/P$^+$ (drain) and is required to decrease a leak current.

Figure 8C:
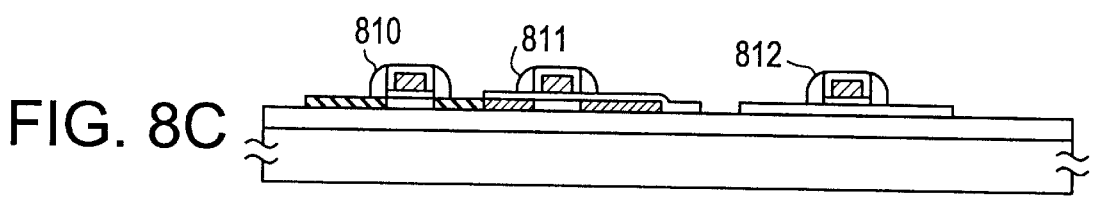

After that, a silicon oxide film having a thickness of 4000 to 8000 Å is deposited by plasma CVD. Further, as similar to Embodiment 2, by anisotropy etching, side walls 810, 811 and 812 of a silicon oxide are formed on side surfaces of the gate electrodes. (FIG. 8C)

Figure 8D:
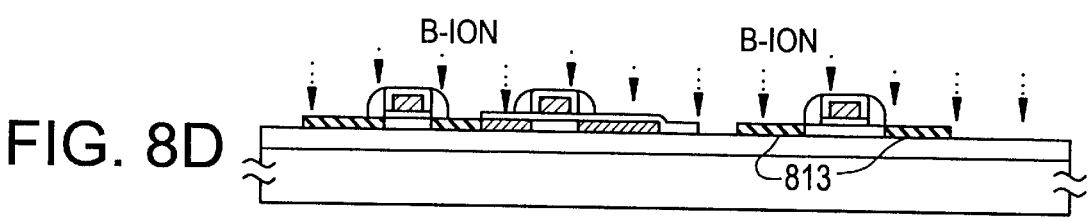

By ion doping, boron is introduced again. It is desired that a dose is approximately equal to that of the process of FIG. 8A. In the embodiment, the dose is 1×10$^{15}$ atoms/cm$^2$, and an accelerating voltage is 20 keV. Since an accelerating voltage is low, boron is not doped into the N-channel type TFT on which the gate insulating film 803 is formed, so that boron is mainly doped into source and drain regions of the P-channel type TFTs for a peripheral circuit and an active matrix circuit. As a result, source and drain regions 813 of a TFT for an active matrix circuit are formed. This TFT has an offset structure in which the gate electrode is spaced apart from the source and drain regions. (FIG. 8D)

Figure 8E:
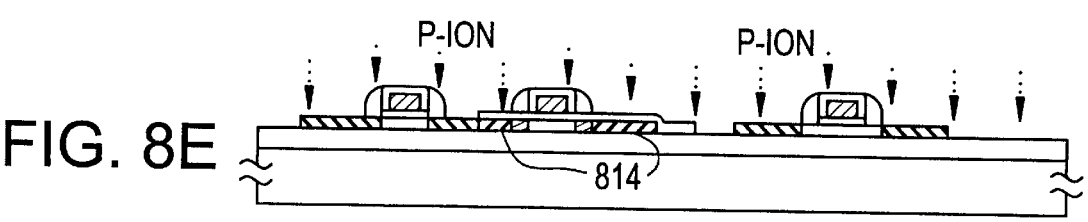

Next, phosphorous is introduced. It is preferred that a dose is larger 1 to 3 orders (figures) than that in the first phosphorus doping process of FIG. 8B. In the embodiment, the dose is 50 times the dose of the first phosphorus doping, that is, 5×10$^{14}$ atoms/cm$^2$. An accelerating voltage is 80 kV. As a result, regions (source/drain) 814 into which phosphorus is introduced at a high concentration are formed. Also, low concentration regions (LDDs) 815 remain under the side walls. On the other hand, since phosphorus ion is almost implanted into a base film in the P-channel type TFT, phosphorus does not influence a conductivity type. (FIG. 8E)

After the doping process, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$.

Figure 8F:
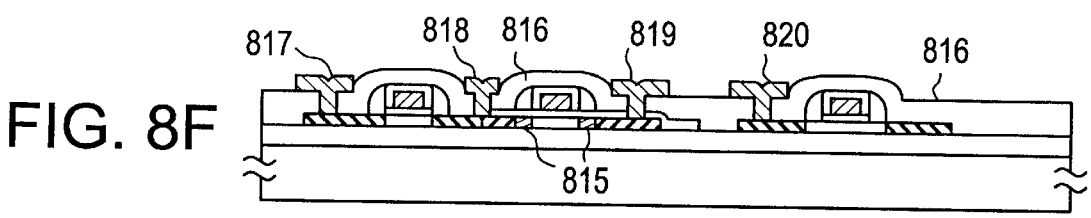

A silicon nitride film having a thickness of 5000 Å is formed as a first interlayer insulator 816 on a whole surface by CVD. Contact holes are formed in source and drain regions of a TFT, and then aluminum electrode arrangements 817, 818, 819 and 820 are formed. By the above process, a peripheral circuit region is formed. (FIG. 8F)

Figure 8G:
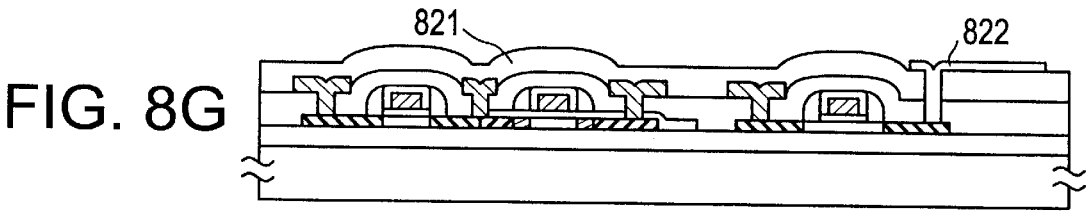

Further, a silicon oxide film having a thickness of 3000 Å is formed as a second interlayer insulator 821 by CVD. Contact holes are formed by etching the silicon oxide film, and then a pixel electrode 822 is formed using a transparent conductive film in a TFT for an active matrix circuit. By the above process, an active matrix type liquid crystal display substrate is produced. (FIG. 8G)

[Embodiment 7]

FIGS. 9A to 9F show a seventh embodiment. A silicon oxide film having a thickness of 1000 to 1500 Å, for example, 2000 Å, is formed as a base oxide film 1102 on a substrate (Corning 7059, a size of 300 mm×400 mm or 100 mm×100 mm) 1101 by sputtering in an oxygen atmosphere. To improve mass productivity, the oxide film may be formed by decomposing and depositing a TEOS using plasma CVD. Such formed silicon oxide film may be annealed at 400 to 650° C.

An amorphous silicon film having a thickness of 300 to 5000 Å, preferably 400 to 1000 Å, for example, 500 Å is deposited by plasma CVD and LPCVD, and then is placed in a reduced atmosphere at 550 to 600° C. for 8 to 24 hours, to crystallize it. In this state, crystallization may be promoted by adding a metal element such as nickel which promotes crystallization, at an extremely small quantity. This process may be performed by laser irradiation. The crystallized silicon film is etched to form an island region 1103. Further, a silicon oxide film 1104 having a thickness of 700 to 1500 Å, for example, 1200 Å, is formed as a gate insulating film on the silicon film by plasma CVD.

An aluminum (including Sc (scandium) of 0.1 to 0.3 weight %) film having a thickness of 1000 Å to 3 $\mu$m, for example, 5000 Å, is formed by sputtering and then etched to form a gate electrode 1105 and a gate electrode arrangement (wiring) 1106. (FIG. 9A) Anodization is performed by supplying a current to the gate electrode 1105 and the gate electrode arrangement 1106 in an electrolytic solution, so that anodic oxides 1107 each having a thickness of 500 to 2500 Å, for example, 2000 Å, are formed. The electrolytic solution is obtained by diluting an ethylene glycol with L-tartaric acid at a concentration of 5% and by adjusting it at 7.0±0.2 pH using ammonia. The substrate is immersed into the electrolytic solution. A positive (+) side terminal of a constant current source is connected with the gate electrode/arrangement on the substrate and a negative (−) side terminal of the constant current source is connected with a platinum electrode, and then a voltage is applied in a constant current state with 20 mA. Oxidization is continued until the applied voltage reaches 150 V. Further, oxidization is continued until a current reaches 0.1 mA or less while applying 150 V in a constant voltage state. As a result, an aluminum oxide film having a thickness of 2000 Å is obtained.

By plasma CVD using a mixed gas ($NH_3/SiH_4/H_2$), a silicon nitride film 1108 having a thickness of 100 to 2000 Å, preferably, 200 to 1000 Å, for example, 500 Å, is formed. Another CVD may be used in the film formation. However, it is desired that step coverage of a gate electrode is superior.

Figure 9A:
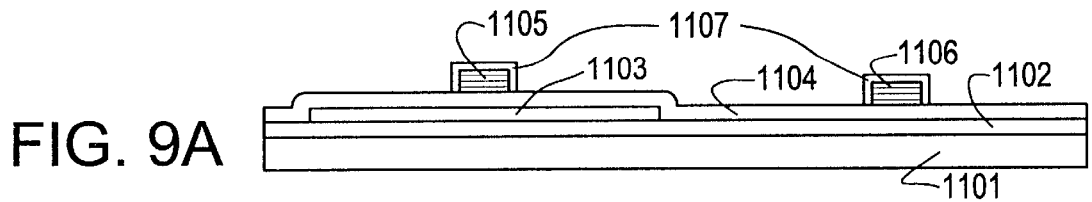
FIGS. 9A and 9F show a forming process of a TFT circuit according to a seventh embodiment.
Figure 9B:
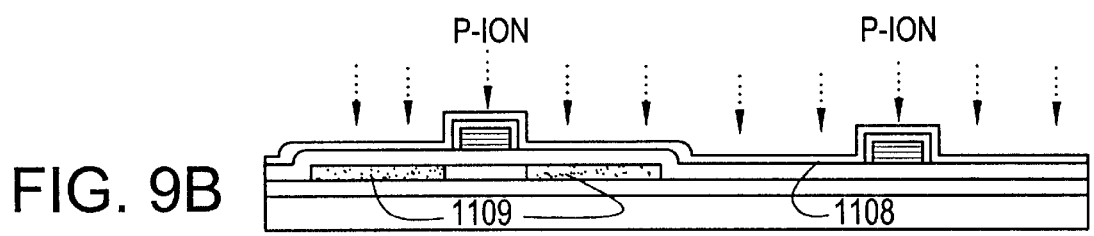

By ion doping, an impurity (phosphorus, P) is implanted into the island silicon film 1103 using a gate electrode portion as a mask in a self-alignment, to form low concentration impurity regions (LDDs) 1109 as shown in FIG. 9B. A dose is $1\times10^{13}$ to $5\times10^{14}$ atoms/cm$^2$, for example, $5\times10^{13}$ atoms/cm$^2$. An accelerating voltage is 10 to 90 kV, for example, 80 kV. (FIG. 9B)

Figure 9C:
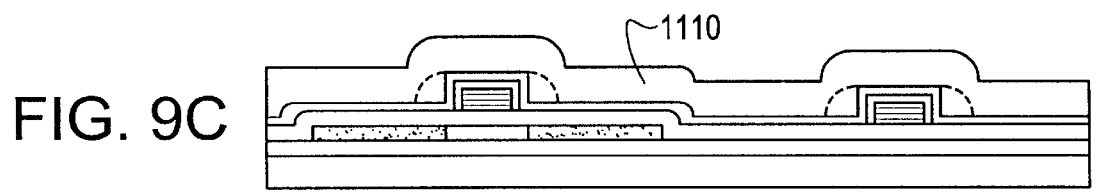

By plasma CVD, a silicon oxide film 1110 is deposited. Raw gases are TEOS and oxygen, or monosilane and nitrous oxide. A suitable thickness of the silicon oxide film 1110 is changed by a height (thickness) of a gate electrode/arrangement. When a height (thickness) of the gate electrode/arrangement including a silicon nitride film is about 5000 Å, the suitable thickness is preferably 2000 Å to 1.2 $\mu$m which is ⅓ to 2 times the height of the gate electrode/arrangement, 6000 Å in the embodiment. In this film formation, it is necessary to obtain not only uniformity of a film thickness in an even portion but also superior step coverage. As a result, a thickness of a silicon oxide film formed on a side surface portion of the gate electrode/arrangement is thick by a portion as shown in a dotted line of FIG. 9C. (FIG. 9C)

Figure 9D:
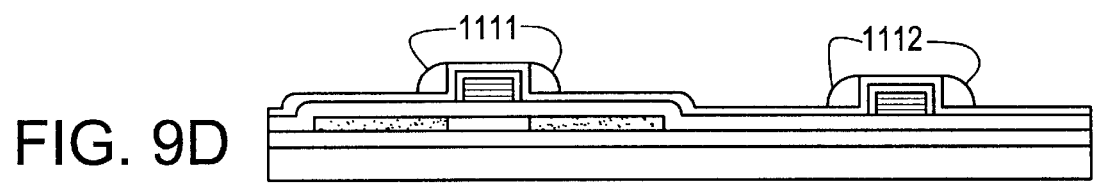

By anisotropy etching using a well known reactive ion etching (RIE), the silicon oxide film 1110 is etched. This etching is completed when etching reaches the silicon nitride film 1108. The silicon nitride film is not etched easily by anisotropy etching using the RIE, so that the gate insulating film 1104 is not etched. By the above process, insulators (side walls) 1111 and 1112 each having a substantially rectangular shape remain in side surfaces of the gate electrode/arrangement. (FIG. 9D)

Figure 9E:
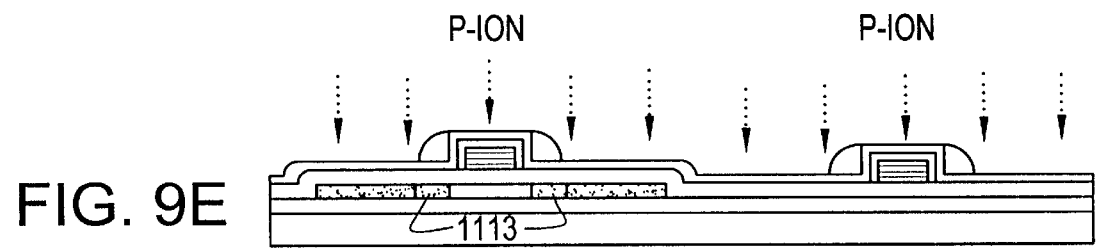

By ion doping, phosphorous (P) is introduced again. It is preferred that a dose is larger 1 to 3 orders (figures) than that in the process of FIG. 9B. In the embodiment, the dose is 40 times the dose of first phosphorus doping, that is, $2\times10^{15}$ atoms/cm$^2$. An accelerating voltage is 80 kV. As a result, regions (source/drain) 1114 into which phosphorus is introduced at a high concentration are formed. Also, low concentration regions (LDDs) 1113 remain under the side walls. (FIG. 9E)

A KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$. In the embodiment, since aluminum is used in a gate electrode/arrangement, there is a problem in heat resistance, so that it is difficult to use aluminum. However, when a gate electrode is formed using a material having a high heat resistance, instead of laser irradiation, thermal annealing may be performed.

A silicon oxide film having a thickness of 5000 Å is formed as an interlayer insulator 1115 on a whole surface by CVD. Contact holes are formed in source and drain regions of a TFT, and then an aluminum arrangement 1116 and an aluminum electrode 1117 in the second layer are formed. A thickness of the aluminum arrangement is approximately equal to that of the gate electrode/arrangement, and 4000 to 6000 Å.

Figure 9F:
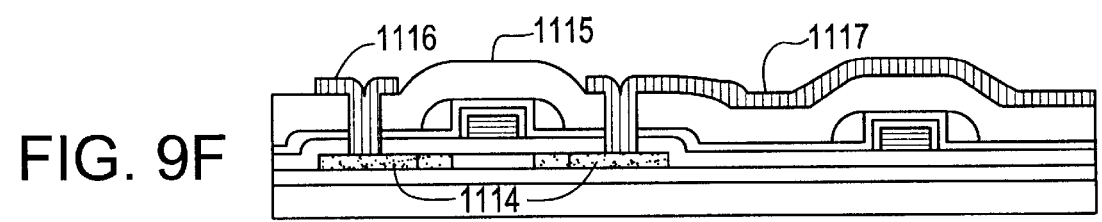

By the above process, an N-channel type TFT having LDDs is completed. In order to activate impurity regions, hydrogen annealing may be further performed at 200 to 400° C. Since a step in an overlap portion which the second layer arrangement 1117 overlaps the gate arrangement 1106 has a small sloop by the side walls 112, although a thickness of the second layer arrangement is approximately (nearly) equal to a gate electrode/arrangement, disconnection in a step is not almost observed. (FIG. 9F)

With respect to a thickness of the second layer arrangement, when a thickness of a gate electrode/arrangement is x (Å) and a thickness of the second layer arrangement is y (Å), if y≧x−1000 (Å), a remarkably disconnection is not observed in an experiment by the inventors. The smaller value y is preferred. In particular, in a circuit which it is necessary to even (smooth) a surface of a substrate, such as an active matrix circuit of a liquid crystal display device, it is desired that x−1000 (Å)≦y ≦x+1000 (Å).

[Embodiment 8]

FIGS. 10A to 10F show an eighth embodiment. The embodiment relates to a nomolithic type active matrix circuit in which an active matrix circuit and a driver circuit are formed simultaneously on the same substrate. In the embodiment, a switching element of an active matrix circuit has a P-channel type TFT, and a driver circuit has a complementary type circuit constructed by N-channel type and P-channel type TFTs. In figures, an N-channel type TFT used in a driver circuit is shown in a left side and a P-channel type TFT used in the driver circuit and an active matrix circuit is shown in a right side. A P-channel type TFT is used as a switching element of an active matrix circuit because a leak current (off current) is small.

As similar to Embodiment 7, a silicon oxide film is formed as a base oxide film 1202 on a substrate (Corning 7059) 1201. Island silicon semiconductor regions are formed and then silicon oxide film 1203 is formed as a gate insulating film on the silicon semiconductor regions. An aluminum film having a thickness of 5000 Å is formed to obtain gate electrodes 1204 and 1205. After that, as similar to Embodiment 7, anodization is performed to form anodic oxides 1206 each having a thickness of 2000 Å around each gate electrode (in upper and side surfaces of each gate electrode). A silicon nitride film 1207 having a thickness of 100 to 2000 Å, for example, 1000 Å, is formed. By ion doping, phosphorus (P) is implanted using a gate electrode portion as a mask, to form low concentration N-type impurity regions 1208 and 1209. A dose is $1\times10^{13}$ atoms/cm$^2$.

Figure 10A:
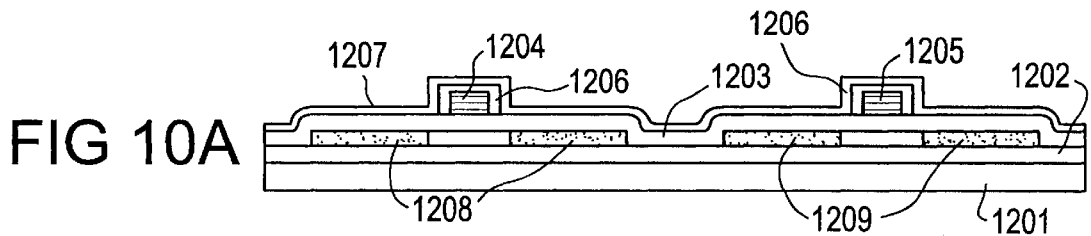
FIGS. 10A and 10F show a forming process of a TFT circuit according to an eighth embodiment.

A KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$. (FIG. 10A)

Figure 10B:
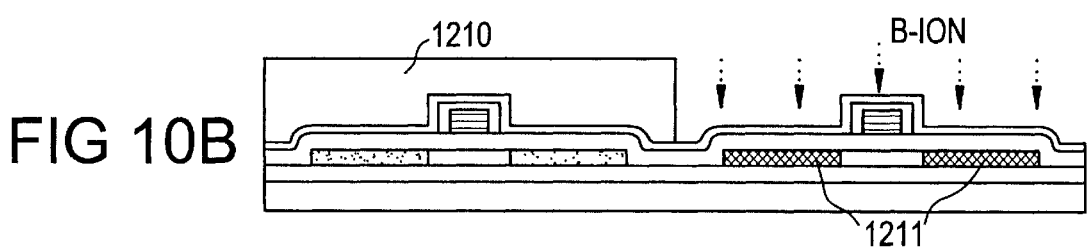

After an N-channel type TFT is masked by a photoresist 1210, boron (B) having a high concentration is doped by ion doping. A dose is $5\times10^{15}$ atoms/cm$^2$. An accelerating voltage is 65 kV. As a result, the impurity regions 1208 which becomes a weak N-type by a previous phosphorous doping becomes P-type impurity regions 1211 by inverting into an intense P-type. After that, the impurity is activated by laser irradiation again. (FIG. 10B)

Figure 10C:
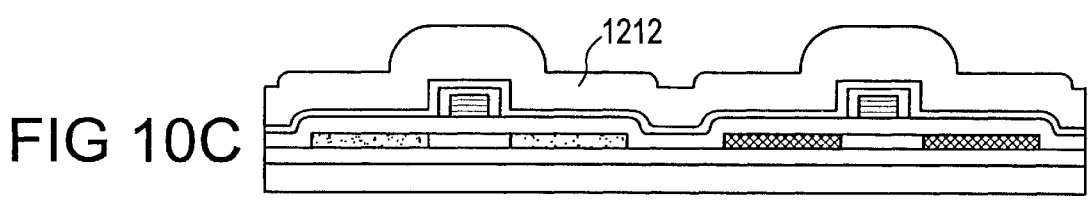

After the photoresist 1210 as a mask is removed, a silicon oxide film 1212 having a thickness of 4000 to 8000 Å is deposited by plasma CVD. (FIG. 10C)

Figure 10D:
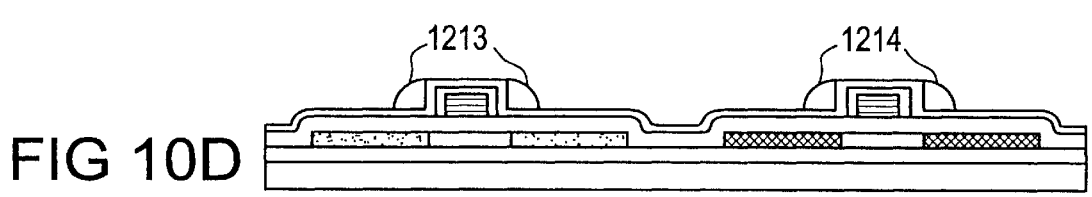

As similar to Embodiment 7, by anisotropy etching, side walls 1213 and 1214 of a silicon oxide are formed on side surfaces of the gate electrodes. (FIG. 10D)

Figure 10E:
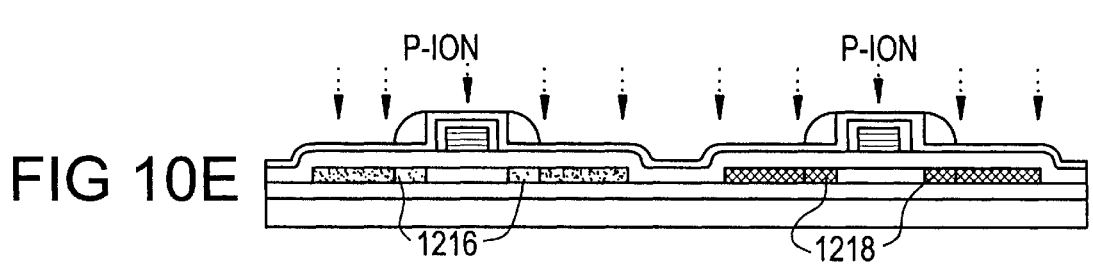

By ion doping, phosphorous (P) is introduced again. It is preferred that a dose is larger 1 to 3 orders (figures) than that in the process of FIG. 10A and ⅒ to ⅔ of the dose in the process of FIG. 10B. In the embodiment, the dose is 200 times the dose of first phosphorus doping, that is, $2\times10^{15}$ atoms/cm$^2$. This dose is 40% of the dose of boron in the process of FIG. 10B. An accelerating voltage is 80 kV. As a result, regions (source/drain) 1215 into which phosphorus is introduced at a high concentration are formed. Also, low concentration regions (LDDs) 216 remain under the side walls. (FIG. 10E)

Further, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$.

Although phosphorous is also doped in a p-channel type TFT (a right side in a figure), since a concentration of previously doped boron is 2.5 times that of phosphorus, a P-type is maintained. Although it appears that P-type regions of the P-channel type TFT include regions 1218 formed under the side walls and regions 1217 formed outside the regions 1218 (in positions opposite to a channel forming regions), a remarkably difference between them on electrical characteristics does not appear. (FIG. 10E)

Figure 10F:
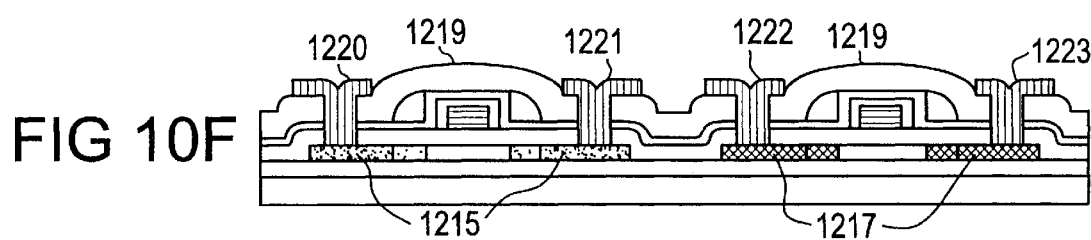

As shown in FIG. 10F, a silicon oxide film having a thickness of 3000 Å is formed as an interlayer insulator 1219 on a whole surface by CVD. Contact holes are formed in source and drain regions of a TFT, and then aluminum electrode arrangements 1220, 1221, 1222 and 1223 are formed. By the above process, a semiconductor integrated circuit using an N-channel type TFT having LDDs are completed.

Although not shown in figures, an interlayer insulator is not so thick in an overlap portion in which the second layer arrangement overlaps a gate electrode/arrangement. However, as similar to Embodiment 7, disconnection is not almost appeared.

In order to prevent deterioration of a TFT by a hot carrier, in the embodiment, an N-channel type TFT has LDD structures. However, LDD regions correspond to parasitic resistors serial-connected to source and drain regions, an operation speed of the TFT is reduced. Therefore, it is desired that a TFT does not include LDD regions in a P-channel type TFT which a mobility is small and deterioration by a hot carrier is less.

In the embodiment, when a doping process is performed, the doped impurity is activated by laser irradiation. However, after all doping processes are completed and immediately before an interlayer insulator is formed, doping processes may be performed.

[Embodiment 9]

Figure 11A:
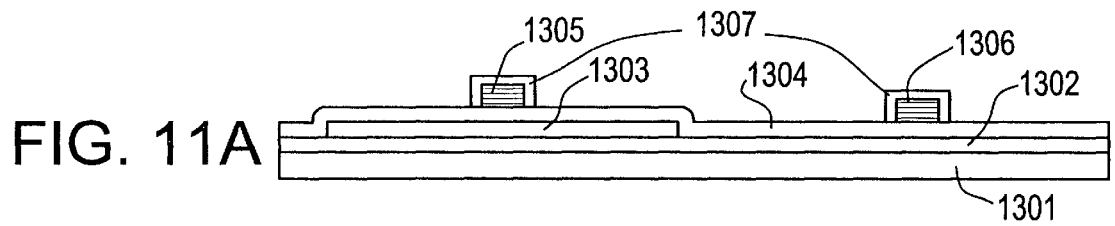
FIGS. 11A to 11E show a cross section view of a TFT circuit according to a ninth embodiment.
Figure 11B:
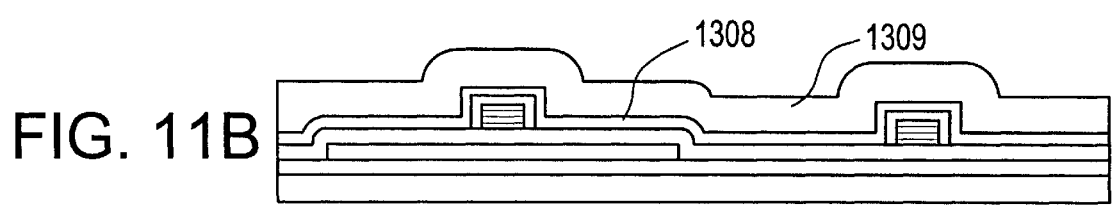
Figure 11C:
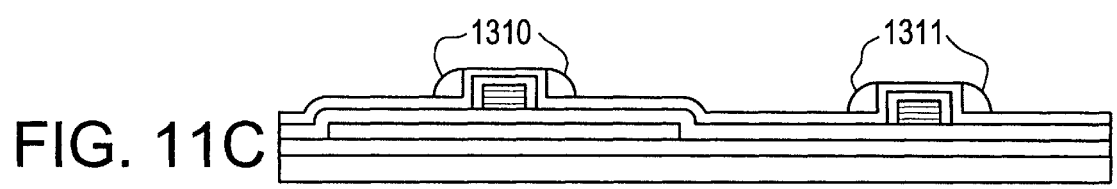
Figure 11D:
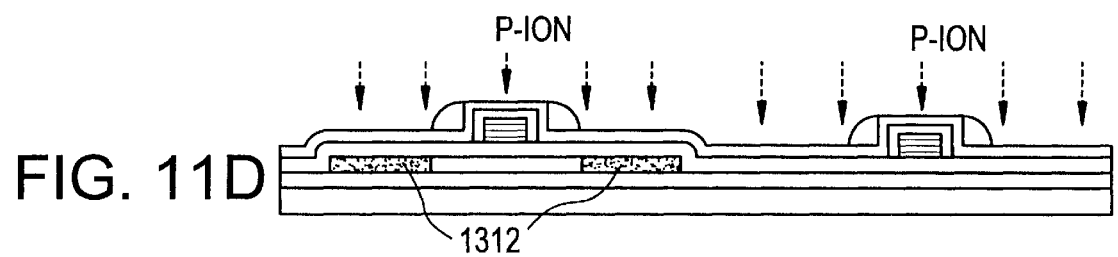
Figure 11E:
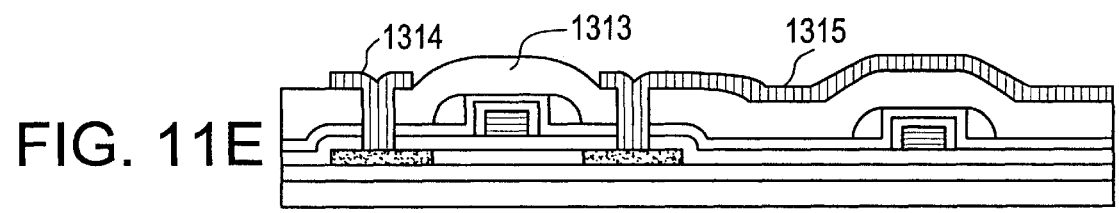

FIGS. 11A and 11E show a ninth embodiment. The embodiment relates to a method for forming a TFT having an offset region using side walls.

A silicon oxide film having a thickness of 2000 Å is formed as a base oxide film 1302 on a substrate 1301. An amorphous silicon film having a thickness of, for example, 500 Å, is deposited by plasma CVD and LPCVD, and then is placed in a reduced atmosphere at 550 to 600° C. for 8 to 24 hours, to crystallize it. The crystallized silicon film is etched to form an island region 1303. Further, a silicon oxide film 1304 having a thickness of 1200 Å is formed on the silicon film by plasma CVD.

An aluminum (including Si of 1 weight % or Sc (scandium) of 0.1 to 0.3 weight %) film having a thickness of 5000 Å is formed by sputtering and then etched to form a gate electrode 1305 and a gate electrode arrangement (wiring) 1306.

Anodic oxides 307 each having a thickness of 2000 Å are formed around the gate electrode (in upper and side surfaces of the gate electrode) by anodization. (FIG. 11A)

Also, by plasma CVD using a mixed gas (NH$_3$/SiH$_4$/H$_2$), a silicon nitride film 1308 having a thickness of 200 to 1000 Å is formed.

By plasma CVD, a silicon oxide film 1309 is deposited. Raw gases are TEOS and oxygen, or monosilane and nitrous oxide. A suitable thickness of the silicon oxide film 1309 is changed by a height (thickness) of a gate electrode/arrangement. When a height (thickness) of the gate electrode/arrangement including a silicon nitride film is about 6000 Å, the suitable thickness is preferably 2000 Å to 1.2 μm which is ⅓ to 2 times the height of the gate electrode/arrangement, 6000 Å in the embodiment. In this film formation, it is necessary to obtain not only uniformity of a film thickness in an even portion but also superior step coverage. (FIG. 11B)

By anisotropy etching using a well known RIE, the silicon oxide film 1309 is etched. This etching is completed when etching reaches the silicon nitride film 1308. The silicon nitride film is not etched easily by anisotropy etching using the RIE, so that the gate insulating film 1304 is not etched. By the above process, insulators (side walls) 1310 and 1311 each having a substantially rectangular shape remain in side surfaces of the gate electrode/arrangement. (FIG. 11C)

By ion doping, phosphorous (P) is introduced. A dose is $1\times10^{14}$ to $5\times10^{17}$ atoms/cm$^2$, for example, $2\times10^{15}$ atoms/cm$^2$. An accelerating voltage is 10 to 90 kV, for example, 80 kV. As a result, regions (source/drain) 1312 into which phosphorus is introduced are formed. Also, offset regions which phosphorus is not introduced are formed under the side walls. (FIG. 11D)

Further, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$.

A silicon oxide film having a thickness of 5000 Å is formed as an interlayer insulator 1313 on a whole surface by CVD. Contact holes are formed in source and drain regions of a TFT, and then an aluminum arrangement 1314 and an aluminum electrode 1315 in the second layer are formed. A thickness of the aluminum arrangement is approximately equal to that of the gate electrode/arrangement, and 4000 to 6000 Å.

By the above process, an N-channel type TFT having offset regions is completed. Since a step in an overlap portion which the second layer arrangement 1315 overlaps the gate electrode arrangement 1306 has a small sloop by the side walls 1311, although a thickness of the second layer arrangement is approximately (nearly) equal to a gate electrode/arrangement, disconnection in a step is not almost observed. (FIG. 11E)

[Embodiment 10]

FIGS. 12A to 12F show a tenth embodiment. In the embodiment, an N-channel type TFT having offsets and an N-channel type TFT having LDDs are formed on the same substrate.

Figure 12A:
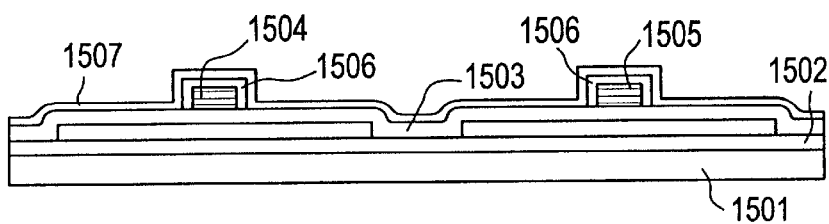
FIGS. 12A to 12F show a forming process of a TFT circuit according to a tenth embodiment.

As similar to Embodiment 7, a silicon oxide film is formed as a base oxide film 1502 on a substrate (Corning 7059) 1501. Island silicon semiconductor regions are formed and then a silicon oxide film (gate insulating film) 1503 is formed on the silicon semiconductor regions. Gate electrodes 1504 and 1505 are formed using an aluminum film (a thickness of 5000 Å). As similar to Embodiment 7, anodic oxides 506 having a thickness 2000 Å are formed around the gate electrodes (on upper and side surfaces of the gate electrodes) by anodization. Further, by plasma CVD, a silicon nitride film 1507 having a thickness of 100 to 2000 Å, for example, 1000 Å, is formed. (FIG. 12A)

After a TFT having offset regions is masked by a photoresist 1508, by ion doping, phosphorus (P) is implanted into a TFT having LDDs using a gate electrode portion as a mask, to form low concentration N-type impurity regions 1509 and 1209. A dose is 1×10$^{13}$ atoms/cm$^2$.

Figure 12B:
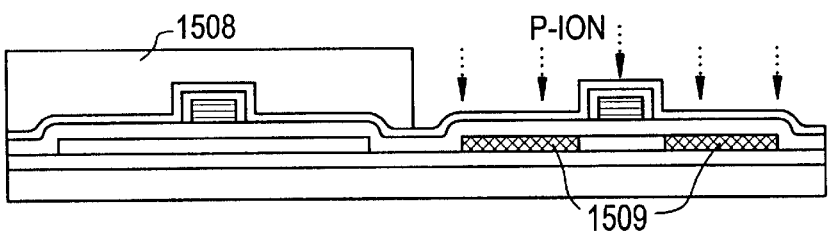

Further, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$. (FIG. 12B)

Figure 12C:
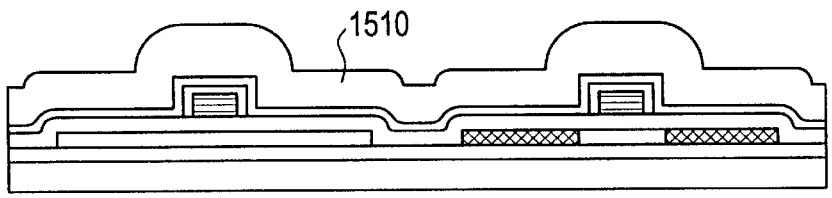

After the photoresist 1508 as a mask is removed, a silicon oxide film 1510 having a thickness of 4000 to 8000 Å, for example, 6000 Å, is deposited by plasma CVD. (FIG. 12C)

Figure 12D:
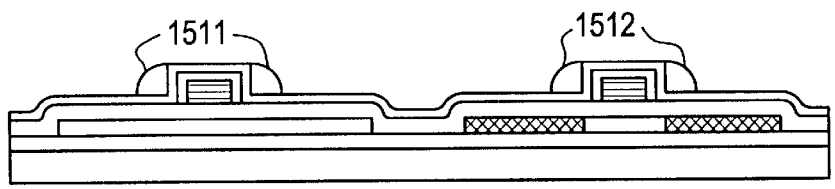

As similar to Embodiment 7, by anisotropy etching, the silicon oxide film 1510 is etched, so that insulators (side walls) 1511 and 1512 are formed on side surfaces of the gate electrode. (FIG. 12D)

By ion doping, phosphorous (P) is introduced again. It is preferred that a dose is larger 1 to 3 orders (figures) than that in the process of FIG. 12B. In the embodiment, the dose is 200 times the dose of first phosphorus doping, that is, 2×10$^{15}$ atoms/cm$^2$. An accelerating voltage is 80 kV. As a result, regions (source/drain) 1513 and 1514 into which phosphorus is introduced at a high concentration are formed. Also, in the process of FIG. 12B, offset regions remain under the side walls in the masked TFT, and low concentration regions (LDDs) 1515 remain under the side walls in the TFT into which phosphorus having a low concentration is doped.

Figure 12E:
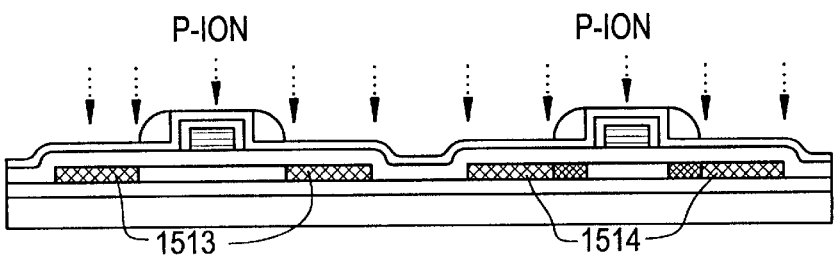

Further, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$. (FIG. 12E)

Figure 12F:
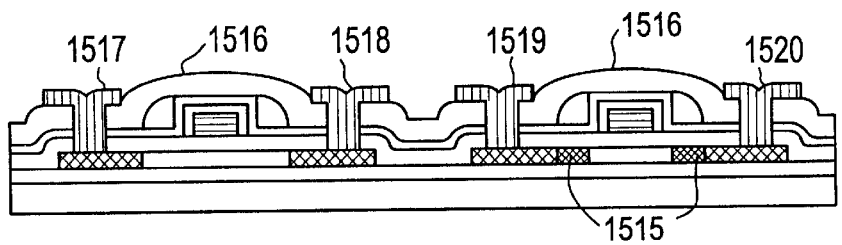

As shown in FIG. 12F, a silicon oxide film having a thickness of 3000 Å is formed as an interlayer insulator 1516 on a whole surface by CVD. Contact holes are formed in source and drain regions of a TFT, and then aluminum electrode arrangements 1517, 1518, 1519 and 1520 are formed.

By the above process, a semiconductor integrated circuit which includes an N-channel type TFT having offsets and an N-channel type TFT having LDDs is produced.

Although not shown in figures, an interlayer insulator is not so thick in an overlap portion in which the second layer arrangement overlaps a gate electrode/arrangement. However, as similar to Embodiment 7, disconnection is not almost appeared.

In the embodiment, when a doping process is performed, the doped impurity is activated by laser irradiation. However, after all doping processes are completed and immediately before an interlayer insulator is formed, doping processes may be performed.

Also, the embodiment shows a case wherein only N-channel type TFTs are used. However, a CMOS circuit may be constructed by forming an N-channel type TFT and a P-channel type TFT on the same substrate. For example, in a monolithic type active matrix circuit in which a peripheral circuit and an active matrix circuit are formed on the same substrate, a CMOS circuit which includes an N-channel LDD type TFT having a high speed operation and a normal PMOS type TFT may be used. Also, in an active matrix circuit which decrease of a leak current is desired, an N-channel type or P-channel type TFT having offsets may be used. In particular, a leak current decreases effectively by using the P-channel type TFT having offsets. In a peripheral circuit, both an N-channel type TFT and a P-channel TFT may include LDDs.

[Embodiment 11]

FIGS. 13A to 13F show an eleventh embodiment. As similar to Embodiment 7, a silicon oxide film having a thickness of 2000 Å is formed as a base oxide film 1602 on a substrate (Corning 7059) 1601, and then an island silicon region having a thickness 500 Å is formed. Further, a silicon oxide film 1603 having a thickness of 1000 Å is formed as a gate insulating film on the silicon region by plasma CVD.

Using an aluminum film having a thickness of 5000 Å, a gate electrode 1604 and a gate electrode arrangement (wiring) 1605 are formed. As similar to Embodiment 7, anodization is performed to form anodic oxides 1606 each having a thickness of 2000 Å around each gate electrode. A silicon nitride film 1607 having a thickness of 100 to 2000 Å, preferably 200 to 1000 Å, for example, 500 Å, is formed.

Figure 13A:
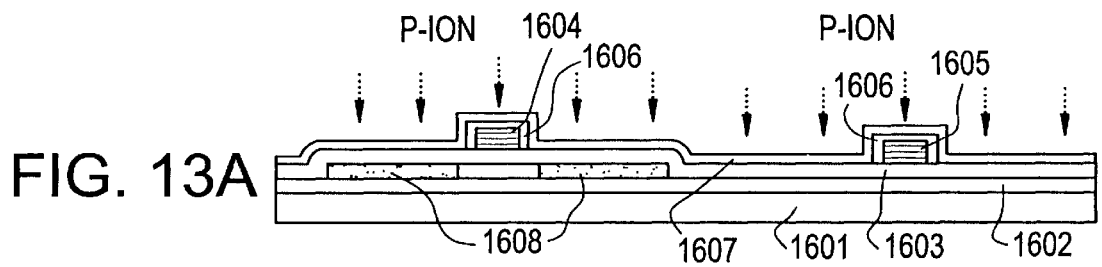
FIGS. 13A to 13F show a forming process of a TFT circuit according to an eleventh embodiment.

By ion doping, an impurity (phosphorus, P) is implanted in the island silicon film using a gate electrode portion as a mask in a self-alignment, to form low concentration impurity regions (LDDs) 1608, as shown in FIG. 13A. A dose is 1×10$^{13}$ to 5×10$^{14}$ atoms/cm$^2$, for example, 5×10$^{13}$ atoms/cm$^2$. Accelerating voltage is 10 to 90 kV, for example, 80 kV. (FIG. 13A)

Figure 13B:
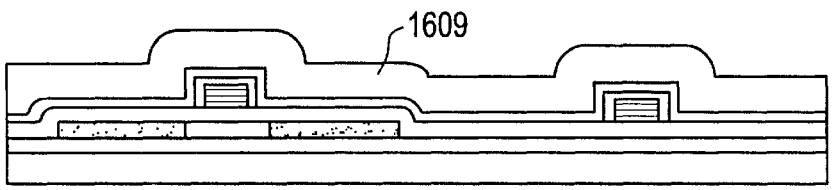

By plasma CVD, a silicon oxide film 1609 having a thickness of 6000 Å is formed. In this film formation, it is necessary to obtain not only uniformity of a film thickness in an even portion but also superior step coverage. (FIG. 13B)

Figure 13C:
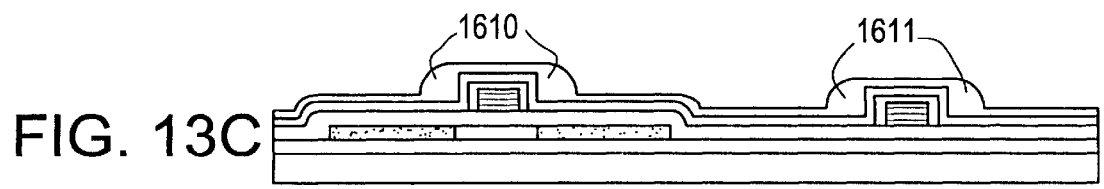

By anisotropy etching using CHF$_3$, the silicon oxide film 1609 is etched. Etching may be performed until is reaches the silicon nitride film 1607. However, as shown in FIG. 13C, etching may be stopped immediately before it reaches the silicon nitride film 1607 to remain the silicon oxide film 1609 slightly. By the above process, insulators (side walls) 1610 and 1611 each having a substantially rectangular shape are formed on side surfaces of gate electrode/arrangements. (FIG. 13C)

Figure 13D:
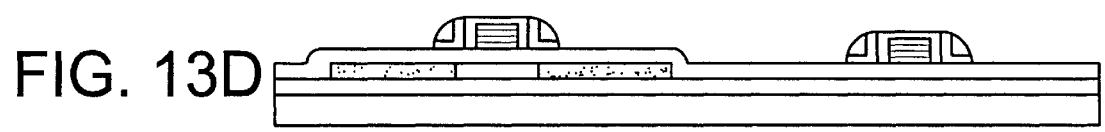

Dry etching is performed using $CH_4/O_2$, to etch the silicon nitride film and the silicon oxide film which remains slightly on the silicon nitride film. Since etching can be measured (monitored) by using an end point monitor (plasma monitor), overetching to a gate electrode and a gate insulating film can be suppressed largely. (FIG. 13D)

Figure 13E:
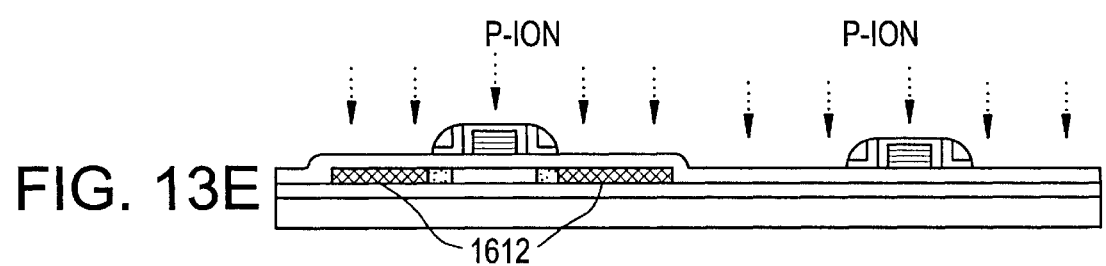

By ion doping, phosphorous (P) is introduced again. It is preferred that a dose is larger 1 to 3 orders (figures) than that in the process of FIG. 13A. In the embodiment, the dose is 40 times the dose of first phosphorus doping, that is, $2\times10^{15}$ atoms/cm$^2$. An accelerating voltage is 80 kV. As a result, regions (source/drain) 1612 into which phosphorus is introduced at a high concentration are formed. Also, low concentration regions (LDDs) 1613 remain under the side walls. (FIG. 13E)

Further, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$.

A silicon oxide film having a thickness of 5000 Å is formed as an interlayer insulator 1614 on a whole surface by CVD. Contact holes are formed in source and drain regions of a TFT, and then an aluminum electrode 1615 and an aluminum electrode arrangement 1616 in the second layer are formed. A thickness of the aluminum electrode arrangement is approximately equal to that of the gate electrode/arrangement, and 4000 to 6000 Å.

Figure 13F:
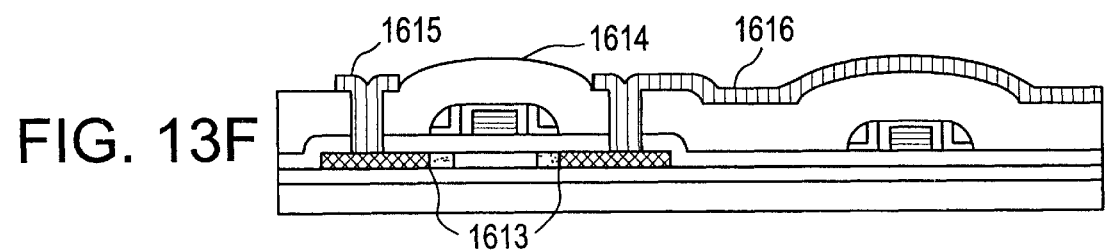

By the above process, an N-channel type TFT having LDDs are completed. In order to activate impurity regions, hydrogen annealing may be further performed at 200 to 400° C. Since a step in an overlap portion which the second layer arrangement 1616 overlaps the gate electrode arrangement 1605 has a small sloop by the side walls 1611, although a thickness of the second layer arrangement is approximately (nearly) equal to a gate electrode/arrangement, disconnection in a step is not almost observed. (FIG. 13F)

[Embodiment 12]

FIGS. 14A to 14F show a twelfth embodiment. In the embodiment, as similar to Embodiment 8, an N-channel type TFT having LDDs and a normal P-channel type TFT are formed on the same substrate. In figures, an N-channel type TFT is shown in a left side and a P-channel type TFT is shown in a right side.

A silicon oxide film is formed as a base oxide film 1702 on a substrate (Corning 7059) 1701. Island silicon semiconductor regions are formed and then silicon oxide film 1703 is formed as a gate insulating film on the silicon semiconductor regions. An aluminum film having a thickness of 5000 Å is formed to obtain gate electrodes 1704 and 1705. The gate electrodes 1704 and 1705 are covered with anodic oxides.

Also, a gate oxide film in an N-channel type TFT is selectively removed by using the gate electrode 1704 as a mask, to expose a semiconductor layer. Then, a silicon nitride film 1706 having a thickness of 100 to 2000 Å, preferably 200 to 1000 Å, for example, 600 Å, is formed by plasma CVD.

Figure 14A:
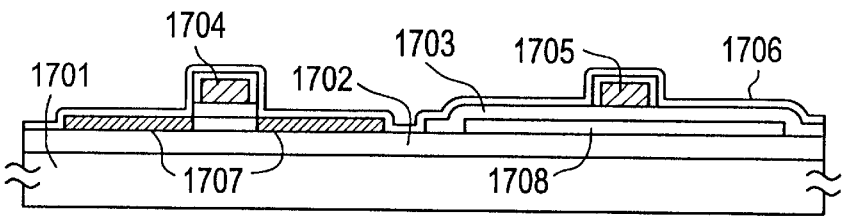
FIGS. 14A to 14F show a forming process of a TFT circuit according to a twelfth embodiment.

By ion doping, phosphorus (P) is implanted using a gate electrode portion as a mask, to form low concentration N-type impurity regions 1707. A dose is $1\times10^{13}$ atoms/cm$^2$. Accelerating voltage is 20 kV. In this doping process, since an accelerating voltage is low, phosphorus is not doped into an island region 1708 in a P-channel type TFT covered with the gate insulating film 1703. (FIG. 14A)

Figure 14B:
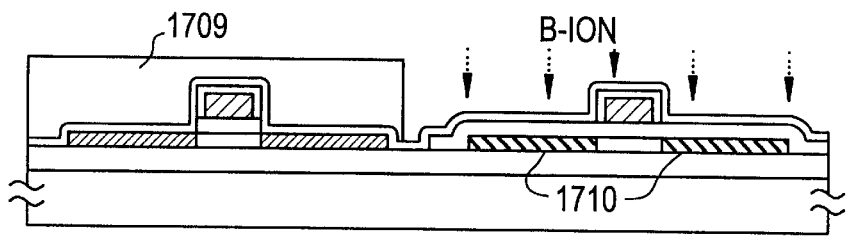

After an N-channel type TFT is masked by a photoresist 1709, boron (B) having a high concentration is doped by ion doping. A dose is $5\times10^{14}$ atoms/cm$^2$. An accelerating voltage is 65 kV. As a result, a P-type impurity regions 1710 are formed in the island region 1708. (FIG. 14B)

In the embodiment, a partial selective doping with a high concentration boron is performed after a whole doping with a low concentration phosphorus. However, a whole doping with a low concentration phosphorus may be performed after a partial selective doping with a high concentration boron.

Figure 14C:
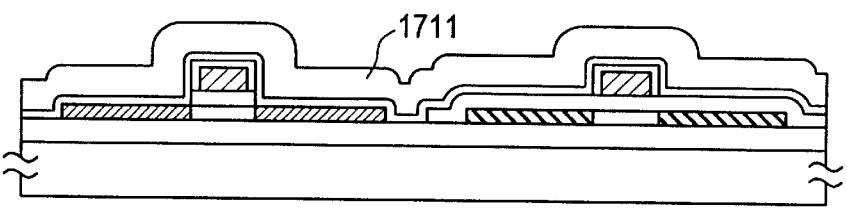

After the photoresist 1709 as a mask is removed, a silicon oxide film 1711 having a thickness of 4000 to 8000 Å is deposited by plasma CVD. (FIG. 14C)

Figure 14D:
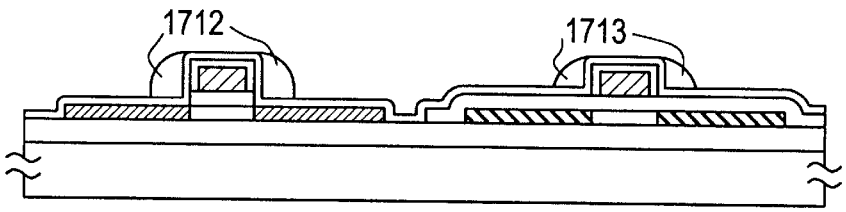

As similar to Embodiment 8, by anisotropy etching, side walls 1712 and 1713 of a silicon oxide are formed on side surfaces of the gate electrodes. (FIG. 14D)

By ion doping, phosphorous (P) is introduced again. It is preferred that a dose is larger 1 to 3 orders (figures) than that in the process of FIG. 14A. In the embodiment, the dose is 200 times the dose of first phosphorus doping, that is, $2\times10^{15}$ atoms/cm$^2$. An accelerating voltage is 20 kV. As a result, regions (source/drain) 1714 into which phosphorus is introduced at a high concentration are formed. Also, low concentration impurity regions (LDDs) 1715 remain under the side walls.

Figure 14E:
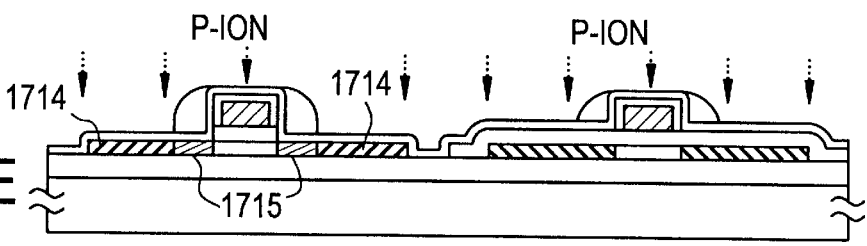

On the other hand, in the P-channel type TFT, since the gate insulating film is formed, phosphorus ion is not implanted. In Embodiment 8, since phosphorus and boron are implanted at a high concentration in a P-channel type TFT, a dose range is limited. In the embodiment, a dose range is not limited. However, it is desired that a dose of phosphorus is low and a dose of boron is high. (FIG. 14E)

After the doping process, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$.

Figure 14F:
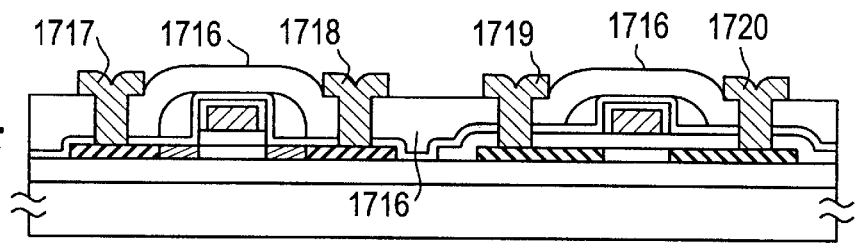

As shown in FIG. 14F, a silicon oxide film having a thickness of 5000 Å is formed as an interlayer insulator 1716 on a whole surface by CVD. Contact holes are formed in source and drain regions of a TFT, and then aluminum electrode arrangements 1717, 1718, 1719 and 1720 are formed. By the above process, a semiconductor integrated circuit using an N-channel type TFT having LDDs are completed.

In the embodiment, in comparison with Embodiment 2, a photolithography process and an etching process are further performed to remove the gate oxide film in the N-channel type TFT. However, an N-type impurity is not introduced substantially into the P-channel type TFT, it is merit that a dose of N type and P-type impurities is can be changed easily.

Also, since phosphorus implanted into the vicinity of a surface of the gate insulating film 1703 in the P-channel type TFT is used to form a glass containing phosphorus by a later laser irradiating process, it is effective in preventing entering of an active ion such as sodium.

[Embodiment 13]

FIGS. 15A to 15G show a thirteenth embodiment. The embodiment relates to a method for forming an active matrix type liquid crystal display device. In figures, an N-channel type TFT having LDDs (center portion) and a normal P-channel type TFT (left side) are logical circuits used in a peripheral circuit and the like, and a P-channel type TFT having offsets (right side) is a switching transistor used in an active matrix array.

A silicon oxide film is formed as a base oxide film on a substrate (Corning 7059). Island silicon semiconductor regions (an island region 1801 for a peripheral circuit and an island region 1802 for an active matrix circuit) are formed and then silicon oxide film 1803 is formed as a gate insulating film on the silicon semiconductor regions. An aluminum film (a thickness of 5000 Å) is formed to obtain gate electrodes 1804 and 1805 for a peripheral circuit and a gate electrode 1806 for an active matrix circuit, which are covered with anodic oxides.

The gate insulating film of the P-channel type TFT for a peripheral circuit and an active matrix circuit is selectively removed using the gate electrodes 1804 and 1806 as masks to expose the semiconductor regions. Also, by plasma CVD, a silicon nitride film 1807 having a thickness of 100 to 2000 Å, preferably 200 to 1000 Å, for example, 400 Å, is formed.

Figure 15A:
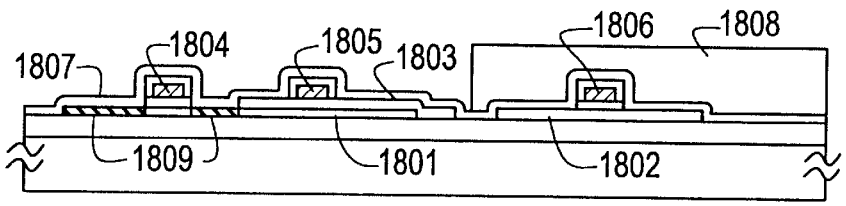
FIGS. 15A to 15G show a forming process of a TFT circuit according to a thirteenth embodiment.

An active matrix circuit region is masked by a photoresist 1808 and then boron is implanted using a gate electrode portion as a mask by ion doping, to form high concentration P-type impurity regions 1809. A dose is $1 \times 10^{15}$ atoms/cm$^2$, and an accelerating voltage is 20 keV. In this doping process, since an accelerating voltage is low, boron is not doped into the N-channel type TFT covered with the gate insulating film 1803. (FIG. 15A)

After that, phosphorus is doped at a low concentration by ion doping. A dose is $1 \times 10^{13}$ atoms/cm$^2$, and an accelerating voltage is 80 kV. As a result, low concentration N-type impurity regions 1810 are formed in the N-channel type TFT. (FIG. 15B)

Figure 15B:
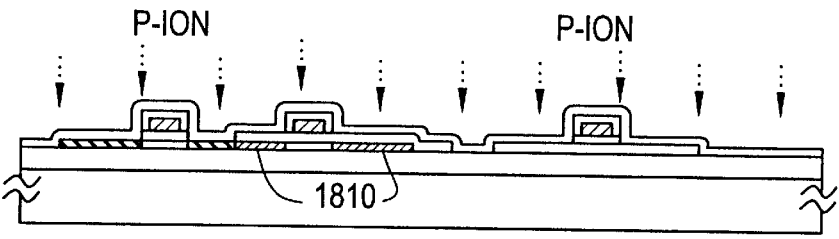

In FIG. 15B, doping is performed after the photoresist 1808 as a mask is removed. Doping may be performed without removing the photoresist. Since an accelerating voltage with respect to phosphorus is high, when the doping is performed without removing the photoresist, phosphorus is not implanted into the active matrix circuit region. Therefore, an ideal P-channel type TFT having an offset is obtained. However, since the photoresist is ashed by doping, removing of the photoresist takes time in a case.

When the photoresist is removed, since an accelerating voltage with respect to phosphorus is high, a concentration peak of phosphorus produces in a portion under the island semiconductor regions. However, it cannot be assured that phosphorus is not doped completely into the island semiconductor regions, so that phosphorus having an extremely small quantity is introduced into the island semiconductor regions. Even though phosphorus is doped in this state, a concentration of phosphorus is less. This is preferred in a TFT for an active matrix circuit which has P+ (source)/n−/I (channel)/n−/P+ (drain) and is required to decrease a leak current.

Figure 15C:
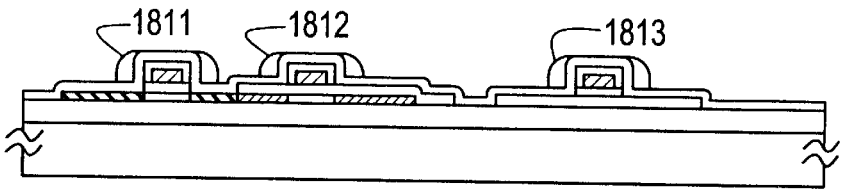

After that, a silicon oxide film having a thickness of 4000 to 8000 Å is deposited by plasma CVD. Further, as similar to Embodiment 8, by anisotropy etching, side walls 1811, 1812 and 1813 of a silicon oxide are formed on side surfaces of the gate electrodes. (FIG. 15C)

Figure 15D:
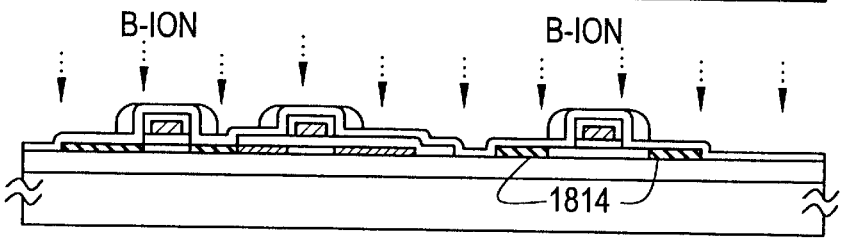

By ion doping, boron is introduced again. It is desired that a dose is approximately equal to that of the process of FIG. 15A. In the embodiment, the dose is $1 \times 10^{15}$ atoms/cm$^2$, and an accelerating voltage is 20 keV. Since an accelerating voltage is low, boron is not doped into the N-channel type TFT on which the gate insulating film 1803 is formed, so that boron is mainly doped into source and drain regions of the P-channel type TFTs for a peripheral circuit and an active matrix circuit. As a result, source and drain regions 1814 of a TFT for an active matrix circuit are formed. This TFT has an offset structure in which the gate electrode is spaced apart from the source and drain regions. (FIG. 15D)

Figure 15E:
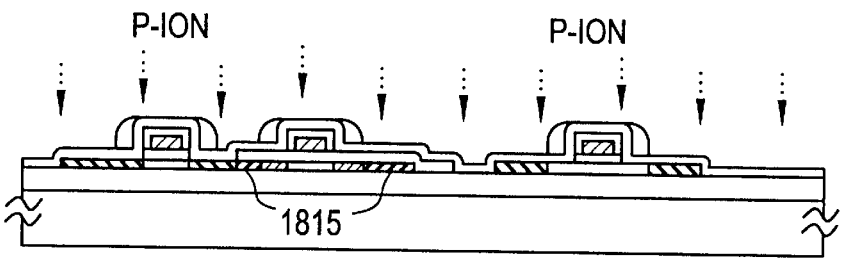

Next, phosphorous is introduced. It is preferred that a dose is larger 1 to 3 orders (figures) than that in the first phosphorus doping process of FIG. 15B. In the embodiment, the dose is 50 times the dose of the first phosphorus doping, that is, $5 \times 10^{14}$ atoms/cm$^2$. An accelerating voltage is 80 kV. As a result, regions (source/drain) 1815 into which phosphorus is introduced at a high concentration are formed. Also, low concentration regions (LDDs) 816 remain under the side walls. On the other hand, since phosphorus ion is almost implanted into a base film in the P-channel type TFT, phosphorus does not influence a conductivity type. (FIG. 15E)

After the doping process, a KrF excimer laser (wavelength of 248 nm and pulse width of 20 ns) is irradiated to activate the doped impurity. A suitable energy density of a laser is 200 to 400 mJ/cm$^2$, preferably 250 to 300 mJ/cm$^2$.

Figure 15F:
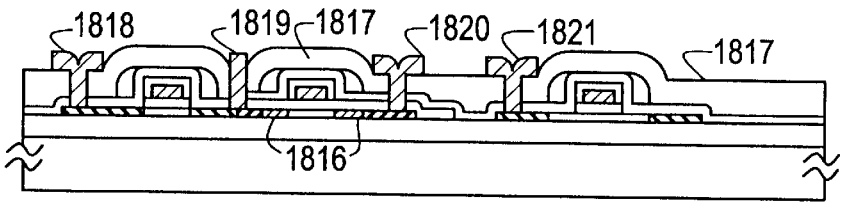

A silicon nitride film having a thickness of 5000 Å is formed as a first interlayer insulator 1817 on a whole surface by CVD. Contact holes are formed in source and drain regions of a TFT, and then aluminum electrode arrangements 1818, 1819, 1820 and 1821 are formed. By the above process, a peripheral circuit region is formed. (FIG. 15F)

Figure 15G:
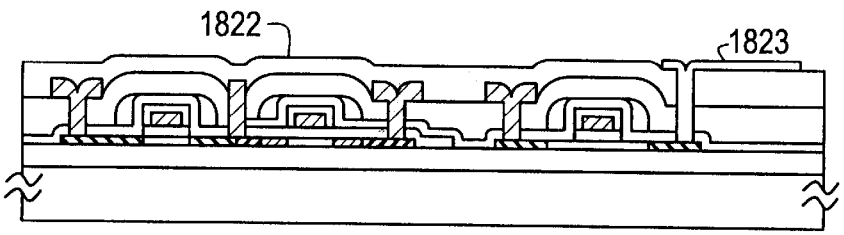

Further, a silicon oxide film having a thickness of 3000 Å A is formed as a second interlayer insulator 1822 by CVD. Contact holes are formed by etching the silicon oxide film, and then a pixel electrode 1823 is formed using a transparent conductive film in a TFT for an active matrix circuit. By the above process, an active matrix type liquid crystal display substrate is produced. (FIG. 15G)

By the present invention, the frequency of disconnection the second layer arrangement in an overlap portion of a gate electrode/arrangement can be decreased. Though an integrated circuit is constructed by a lot of elements and arrangements, if a defect produces in a circuit, a whole circuit may be not operated. Therefore, decrease of the number of defect potions by the present invention produces superior effects in increase of good product rate of an integrated circuit.

Also, by the present invention, a thickness of the second layer arrangement can be approximately equal to that of a gate electrode/arrangement, that is, (the thickness of the gate electrode/arrangement)±1000 (Å). This is preferred in an active matrix circuit of a liquid crystal display device for which a substrate having an even surface is required, The present invention is useful in improving a yield of a TFT integrated circuit.

What is claimed is:

1. A semiconductor device comprising:
    an n-channel type thin film transistor comprising a first semiconductor film formed over a substrate having an insulating surface, a pair of source and drain regions of an n-type conductivity in said first semiconductor film, a channel forming region in said first semiconductor film, at least one lightly doped region with a dose amount of $5 \times 10^{14}$ atoms/cm$^2$ or less formed between said channel forming region and at least one of said source and drain regions, a first gate insulating film adjacent to said channel forming region and a first gate electrode adjacent to said channel forming region with said first gate insulating film interposed therebetween; and
    a p-channel type thin film transistor connected to said n-channel type thin film transistor, said p-channel type thin film transistor comprising a second semiconductor film formed over said substrate, a pair of source and drain regions of a p-type conductivity in said second semiconductor film, a channel forming region between said source and drain regions in said second semiconductor film, a second gate insulating film adjacent to said channel forming region and a second gate electrode adjacent to said channel forming region with said second gate insulating film interposed therebetween, wherein said p-channel type thin film transistor has no lightly doped region in said second semiconductor film.

2. A semiconductor device according to claim 1 wherein the gate electrode is located over the channel forming region in each of the n-channel type thin film transistor and the p-channel type thin film transistor.

3. A semiconductor device comprising:

an n-channel type thin film transistor comprising a first semiconductor film formed over a substrate having an insulating surface, a pair of source and drain regions of an n-type conductivity in said first semiconductor film, a channel forming region in said first semiconductor film, at least one lightly doped region formed between said channel forming region and at least one of said source and drain regions, a first gate insulating film adjacent to said channel forming region and a first gate electrode adjacent to said channel forming region with said first gate insulating film interposed therebetween; and a p-channel type thin film transistor connected to said n-channel type thin film transistor, said p-channel type thin film transistor comprising a second semiconductor film formed over said substrate, a pair of source and drain regions of a p-type conductivity in said second semiconductor film, a channel forming region in said second semiconductor film between said source and drain regions, a second gate insulating film adjacent to said channel forming region and a second gate electrode adjacent to said channel forming region with said second gate insulating film interposed therebetween, wherein said p-channel type thin film transistor has no lightly doped region in said second semiconductor film, and said source and said drain regions are doped with both phosphorus and boron.

4. A semiconductor device according to claim 3 wherein the gate electrode is located over the channel forming region in each of the n-channel type thin film transistor and the p-channel type thin film transistor.

5. A semiconductor device comprising:

a substrate having an insulating surface;

a first semiconductor film and a second semiconductor film formed over said substrate wherein said first semiconductor film constitutes an n-channel type thin film transistor and said second semiconductor film constitutes a p-channel type thin film transistor;

a gate insulating film formed on said first and second semiconductor films;

a pair of first impurity regions formed in said first semiconductor film, said first impurity regions having an n-type conductivity;

a first channel forming region formed in said first semiconductor film between said first impurity regions;

at least one lightly doped region disposed between said first channel forming region and at least one of said first impurity regions wherein said lightly doped region is doped with an n-type impurity at a lower concentration than said first impurity regions;

a pair of second impurity regions formed in said second semiconductor film, said impurity regions having a p-type conductivity;

a second channel forming region in said second semiconductor film between said second impurity regions wherein no lightly doped region is disposed in said second impurity regions, said second impurity regions containing both phosphorus and boron;

a first gate electrode and a second gate electrode formed over the first and second channel forming regions, respectively, with said gate insulating film interposed therebetween; and an insulating film comprising silicon nitride formed over said gate insulating film and said first and second gate electrodes, wherein said gate insulating film and said insulating film cover said first and second semiconductor films except for contact holes opened therein.

6. A semiconductor device comprising:

a substrate having an insulating surface;

a first semiconductor film and a second semiconductor film formed over said substrate wherein said first semiconductor film constitutes an n-channel type thin film transistor and said second semiconductor film constitutes a p-channel type thin film transistor;

a gate insulating film formed on said first and second semiconductor films;

a pair of first impurity regions formed in said first semiconductor film, said first impurity regions having an n-type conductivity;

a first channel forming region formed in said first semiconductor film between said first impurity regions;

at least one lightly doped region disposed between said first channel forming region and at least one of said first impurity regions wherein said lightly doped region is doped with an n-type impurity at a lower concentration than said first impurity regions;

a pair of second impurity regions formed in said second semiconductor film, said impurity regions having a p-type conductivity;

a second channel forming region in said second semiconductor film between said second impurity regions wherein no lightly doped region is disposed in said second impurity regions;

a pair of third impurity regions formed in said second semiconductor film wherein said third impurity regions contain both of phosphorus and boron and are contiguous to said second impurity regions;

a first gate electrode and a second gate electrode formed over the first and second channel forming regions, respectively, with said gate insulating film interposed therebetween; and an insulating film comprising silicon nitride formed over said gate insulating film and said first and second gate electrodes, wherein said gate insulating film and said insulating film cover said first and second semiconductor films except for contact holes opened therein.

7. A semiconductor device having an active matrix circuit comprising a plurality of switching elements formed over a substrate for switching pixels; and a driver circuit for driving said active matrix circuit, said driver circuit comprising:

an n-channel type thin film transistor comprising a first semiconductor film formed over said substrate, a pair of source and drain regions in said first semiconductor film, a channel forming region formed between said source and drain regions, at least one lightly doped region with a dose amount of 5×10$^{14}$ atoms/cm$^2$ or less formed between said channel forming region and at least one of said source and drain regions, a first gate insulating film adjacent to said channel forming region and a first gate electrode adjacent to said channel forming region with said first gate insulating film interposed therebetween; and a p-channel type thin film transistor connected to said n-channel type thin film transistor, said p-channel type thin film transistor comprising a second semiconductor film formed over said second semiconductor film, a channel forming region between a source and a drain regions in said second semiconductor film, a second gate insulating film adjacent to said channel forming region and a second gate electrode adjacent to said channel forming region with said second gate insulating film interposed therebetween, wherein said p-channel type thin film transistor has no lightly doped region in said second semiconductor film.

8. A semiconductor device according to claim 7 wherein the gate electrode is located over the channel forming region in each of the n-channel type thin film transistor and the p-channel type thin film transistor.

9. A semiconductor device having an active matrix circuit comprising a plurality of switching elements formed over a substrate for switching pixels; and a driver circuit for driving said active matrix circuit, said driver circuit comprising:

an n-channel type thin film transistor comprising a first semiconductor film formed over said substrate, a pair of source and drain regions of an n-type conductivity in said first semiconductor film, a channel forming region in said first semiconductor film, at least one lightly doped region formed between said channel forming region and at least one of said source and drain regions, a first gate insulating film adjacent to said channel forming region and a first gate electrode adjacent to said channel forming region with said first gate insulating film interposed therebetween; and a p-channel type thin film transistor connected to said n-channel type thin film transistor, said p-channel type thin film transistor comprising a second semiconductor film formed over said substrate, a pair of source and drain regions of a p-type conductivity in said second semiconductor film, a channel forming region in said second semiconductor film between said source and drain regions, a second gate insulating film adjacent to said channel forming region and a second gate electrode adjacent to said channel forming region with said second gate insulating film interposed therebetween, wherein said p-channel type thin film transistor has no lightly doped region in said second semiconductor film, and said source and said drain regions are doped with both phosphorus and boron.

10. A semiconductor device according to claim 9 wherein the gate electrode is located over the channel forming region in each of the n-channel type thin film transistor and the p-channel type thin film transistor.

11. A semiconductor device having an active matrix circuit comprising a plurality of switching elements formed on an insulating surface of a substrate for switching pixels and a driver circuit for driving said active matrix circuit, said driver circuit comprising:

a first semiconductor film and a second semiconductor film formed over said substrate wherein said first semiconductor film constitutes an n-channel type thin film transistor and said second semiconductor film constitutes a p-channel type thin film transistor;

a gate insulating film formed on said first and second semiconductor films;

a pair of first impurity regions formed in said first semiconductor film, said first impurity regions having an n-type conductivity;

a first channel forming region formed in said first semiconductor film between said first impurity regions;

at least one lightly doped region disposed between said first channel forming region and at least one of said first impurity regions wherein said lightly doped region is doped with an n-type impurity at a lower concentration than said first impurity regions;

a pair of second impurity regions formed in said second semiconductor film, said impurity regions having a p-type conductivity;

a second channel forming region in said second semiconductor film between said second impurity regions wherein no lightly doped region is disposed in said second impurity regions, said second impurity regions containing both phosphorus and boron;

a first gate electrode and a second gate electrode formed over the first and second channel forming regions, respectively, with said gate insulating film interposed therebetween; and an insulating film comprising silicon nitride formed over said gate film and said first and second gate electrodes, wherein said gate insulating film and said insulating film cover said first and second semiconductor films except for contact holes opened therein.

12. A semiconductor device having an active matrix circuit comprising a plurality of switching elements formed on an insulating surface of a substrate for switching pixels and a driver circuit for driving said active matrix circuit, said driver circuit comprising:

a substrate having an insulating surface;

a first semiconductor film and a second semiconductor film formed over said substrate wherein said first semiconductor film constitutes an n-channel type thin film transistor and said second semiconductor film constitutes a p-channel type thin film transistor;

a gate insulating film formed on said first and second semiconductor films;

a pair of first impurity regions formed in said first semiconductor film, said first impurity regions having an n-type conductivity;

a first channel forming region formed in said first semiconductor between said first impurity regions;

at least one lightly doped region disposed between said first channel forming region and at least one of said first impurity regions wherein said lightly doped region is doped with an n-type impurity at a lower concentration than said first impurity region;

a pair of second impurity regions formed in said second semiconductor film, said impurity regions having a p-type conductivity;

a second channel forming region in said second semiconductor film between said second impurity regions wherein no lightly doped region is disposed in said second impurity regions;

a pair of third impurity regions formed in said second semiconductor film wherein said third impurity regions contain both of phosphorus and boron and are contiguous to said second impurity regions;

a first gate electrode and a second gate electrode formed over the first and second channel forming regions, respectively, with said gate insulating film interposed therebetween; and an insulating film comprising silicon nitride formed over said gate insulating film and said first and second gate electrodes, wherein said gate insulating film and said interlayer insulating film cover said first and second semiconductor films except for contact holes opened therein.

13. A semiconductor device according to claim 1 wherein said p-channel type thin film transistor is complementarily connected to said n-channel type thin film transistor.

14. A semiconductor device according to claim 3 wherein said p-channel type thin film transistor is complementarily connected to said n-channel type thin film transistor.

15. A semiconductor device according to claim 7 wherein said p-channel type thin film transistor is complementarily connected to said n-channel type thin film transistor.

16. A semiconductor device according to claim 9 wherein said p-channel type thin film transistor is complementarily connected to said n-channel type thin film transistor.

17. A semiconductor device comprising an n-channel type thin film transistor and a p-channel type thin film transistor connected with said n-channel type thin film transistor, each comprising:

a semiconductor film formed over a substrate having an insulating surface;

a pair of source and drain regions in said semiconductor film;

a channel region in said semiconductor film; and a gate insulating film adjacent to said channel region and a gate electrode adjacent to said channel region with said gate insulating film interposed therebetween, wherein said n-channel type thin film transistor has at least one lightly doped region with a dose amount of $5 \times 10^{14}$ atoms/cm$^2$ or less between said channel region and at least one of said source and drain regions, and wherein said p-channel type thin film transistor has no lightly doped region in said semiconductor film.

18. A semiconductor device according to claim 17 wherein the gate electrode is located over the channel region in each of the n-channel type thin film transistor and the p-channel type thin film transistor.

19. A semiconductor device according to claim 17 wherein said p-channel type thin film transistor is complementarily connected to said n-channel type thin film transistor.

20. A semiconductor device comprising an n-channel type thin film transistor and a p-channel type thin film transistor, each comprising:

a semiconductor film formed over a substrate having an insulating surface;

a pair of source and drain regions in said semiconductor film;

a channel region in said semiconductor film; and a gate insulating film adjacent to said channel region and a gate electrode adjacent to said channel region with said gate insulating film interposed therebetween, wherein said n-channel type thin film transistor has at least one lightly doped region between said channel region and at least one of said source and drain regions, and wherein said p-channel type thin film transistor has no lightly doped region in said semiconductor film, and said source and drain regions are doped with both phosphorus and boron.

21. A semiconductor device according to claim 20 wherein the gate electrode is located over the channel forming region in each of the n-channel type thin film transistor and the p-channel type thin film transistor.

22. A semiconductor device according to claim 20 wherein said p-channel type thin film transistor is complementarily connected to said n-channel type thin film transistor.

23. A semiconductor device comprising an n-channel type thin film transistor and a p-channel type thin film transistor, each comprising:

a semiconductor film formed over a substrate having an insulating surface;

a gate insulating film formed on said semiconductor film;

a pair of impurity regions formed in said semiconductor film;

a channel region formed in said semiconductor film between said pair of impurity regions;

a gate electrode formed over the channel region with said gate insulating film interposed therebetween; and an interlayer insulating film comprising silicon nitride formed over said gate insulating film and said gate electrode, wherein said n-channel type thin film transistor has at least one lightly doped region disposed between said channel region and at least one of said pair of impurity regions and said p-channel type thin film transistor has no lightly doped region in said pair of impurity regions, and said pair of impurity regions of said p-channel type thin film transistor containing both phosphorus and boron, and wherein said gate insulating film and said interlayer insulating film cover said semiconductor film except for contact holes opened therein.

24. A semiconductor device comprising an n-channel type thin film transistor and a p-channel type thin film transistor, each comprising:

a semiconductor film formed over a substrate having an insulating surface;

a gate insulating film formed on said semiconductor film;

a pair of impurity regions formed in said semiconductor film;

a channel region formed in said semiconductor film between said pair of impurity regions;

a gate electrode formed over the channel region with said gate insulating film interposed therebetween; and an insulating film formed over said gate insulating film and said first and second gate electrodes, wherein said n-channel type thin film transistor has at least one lightly doped region disposed between said channel region and at least one of said pair of impurity region, and said p-channel type thin film transistor has no lightly doped region in said pair of impurity regions, and said pair of impurity regions of said p-channel type thin film transistor containing both phosphorus and boron, and wherein said gate insulating film and said interlayer insulating film cover said semiconductor film except for contact holes opened therein.

25. A semiconductor device having an active matrix circuit comprising a plurality of switching elements formed over a substrate for switching pixels; and a driver circuit for driving said active matrix circuit, said driver circuit comprising an n-channel type thin film transistor and a p-channel type thin film transistor connected with said n-channel type thin film transistor, each comprising:

a semiconductor film formed over a substrate having an insulating surface;

a pair of source and drain regions in said semiconductor film;

a channel region in said semiconductor film; and a gate insulating film adjacent to said channel region and a gate electrode adjacent to said channel region with said gate insulating film interposed therebetween, wherein said n-channel type thin film transistor has at least one lightly doped region with a dose amount of $5 \times 10^{14}$ atoms/cm$^2$ or less between said channel region and at least one of said source and drain regions, and wherein said p-channel type thin film transistor has no lightly doped region in said semiconductor film.

26. A semiconductor device according to claim 25 wherein the gate electrode is located over the channel forming region in each of the n-channel type thin film transistor and the p-channel type thin film transistor.

27. A semiconductor device according to claim 25 wherein said p-channel type thin film transistor is complementarily connected to said n-channel type thin film transistor.

28. A semiconductor device having an active matrix circuit comprising a plurality of switching elements formed over a substrate for switching pixels; and a driver circuit for driving said active matrix circuit, said driver circuit comprising an n-channel type thin film transistor and a p-channel type thin film transistor, each comprising:

a semiconductor film formed over a substrate having an insulating surface;

a pair of source and drain regions in said semiconductor film;

a channel region in said semiconductor film; and a gate insulating film adjacent to said channel region and a gate electrode adjacent to said channel region with said gate insulating film interposed therebetween, wherein said n-channel type thin film transistor has at least one lightly doped region between said channel region and at least one of said source and drain regions, and wherein said p-channel type thin film transistor has no lightly doped region in said semiconductor film, and said source and drain regions are doped with both phosphorus and boron.

29. A semiconductor device according to claim 28 wherein the gate electrode is located over the channel forming region in each of the n-channel type thin film transistor and the p-channel type thin film transistor.

30. A semiconductor device according to claim 28 wherein said p-channel type thin film transistor is complementarily connected to said n-channel type thin film transistor.

31. A semiconductor device having an active matrix circuit comprising a plurality of switching elements formed over a substrate for switching pixels; and a peripheral circuit for driving said active matrix circuit, said peripheral circuit comprising an n-channel type thin film transistor and a p-channel type thin film transistor, each comprising:

a semiconductor film formed over a substrate having an insulating surface;

a gate insulating film formed on said semiconductor films;

a pair of impurity regions formed in said semiconductor film;

channel region formed in said semiconductor film between said pair of impurity regions;

a gate electrode formed over the channel region with said gate insulating film interposed therebetween; and an insulating film comprising silicon nitride formed over said gate insulating film and said gate electrode, wherein said n-channel type thin film transistor has at least one lightly doped region disposed between said channel region and at least one of said pair of impurity region and said p-channel type thin film transistor has no lightly doped region in said pair of impurity regions of said p-channel type thin film transistor containing both phosphorus and boron, and wherein said gate insulating film and said interlayer insulating film cover said semiconductor film except for contact holes opened therein.

32. A semiconductor device having an active matrix circuit comprising a plurality of switching elements formed over a substrate for switching pixels; and a peripheral circuit for driving said active matrix circuit, said peripheral circuit comprising an n-channel type thin film transistor and a p-channel type thin film transistor, each comprising:

a semiconductor film formed over a substrate having an insulating surface;

a gate insulating film formed on said semiconductor film;

a pair of impurity regions formed in said semiconductor film;

a channel region formed in said semiconductor film between said pair of impurity regions;

a gate electrode formed over the channel region with said gate insulating film interposed therebetween; and an interlayer insulating film formed over said gate insulating film and said gate electrode, wherein said n-channel type thin film transistor has at least one lightly doped region disposed between said channel region and at least one of said pair of impurity regions, and said p-channel type thin film transistor has no lightly doped region in said pair of impurity regions, and said pair of impurity regions of said p-channel type thin film transistor containing both phosphorus and boron, and wherein said gate insulating film and said interlayer insulating film cover said semiconductor film except for contact holes opened therein.

33. An input port comprising an n-channel type thin film transistor and a p-channel type thin film transistor, each comprising:

a semiconductor film formed over a substrate having an insulating surface;

a pair of source and drain regions in said semiconductor film;

a channel region in said semiconductor film; and a gate insulating film adjacent to said channel region and a gate electrode adjacent to said channel region with said gate insulating film interposed therebetween, wherein said n-channel type thin film transistor has at least one lightly doped region between said channel region and at least one of said source and drain regions, wherein said p-channel type thin film transistor has no lightly doped region in said semiconductor film, and wherein said source and drain regions of said p-channel type thin film transistor contain both phosphorus and boron.

34. An input port according to claim 33 wherein the gate electrode is located over the channel region in each of the n-channel type thin film transistor and the p-channel type thin film transistor.

35. An input port according to claim 33 wherein said p-channel type thin film transistor is complementarily connected to said n-channel type thin film transistor.

36. A central processing unit comprising an n-channel type thin film transistor and a p-channel type thin film transistor, each comprising:
   a semiconductor film formed over a substrate having an insulating surface;
   a pair of source and drain regions in said semiconductor film;
   a channel region in said semiconductor film; and
   a gate insulating film adjacent to said channel region and a gate electrode adjacent to said channel region with said gate insulating film interposed therebetween,
   wherein said n-channel type thin film transistor has at least one lightly doped region between said channel region and at least one of said source and drain regions,
   wherein said p-channel type thin film transistor has no lightly doped region in said semiconductor film, and
   wherein said source and drain regions of said p-channel type thin film transistor contain both phosphorus and boron.

37. A central processing unit according to claim 36 wherein the gate electrode is located over the channel region in each of the n-channel type thin film transistor and the p-channel type thin film transistor.

38. A central processing unit according to claim 36 wherein said p-channel type thin film transistor is complementarily connected to said n-channel type thin film transistor.

39. A memory circuit comprising an n-channel type thin film transistor and a p-channel type thin film transistor, each comprising:
   a semiconductor film formed over a substrate having an insulating surface;
   a pair of source and drain regions in said semiconductor film;
   a channel region in said semiconductor film; and
   a gate insulating film adjacent to said channel region and a gate electrode adjacent to said channel region with said gate insulating film interposed therebetween,
   wherein said n-channel type thin film transistor has at least one lightly doped region between said channel region and at least one of said source and drain regions,
   wherein said p-channel type thin film transistor has no lightly doped region in said semiconductor film, and
   wherein said source and drain regions of said p-channel type thin film transistor contain both phosphorus and boron.

40. A memory circuit according to claim 39 wherein the gate electrode is located over the channel region in each of the n-channel type thin film transistor and the p-channel type thin film transistor.

41. A memory circuit according to claim 39 wherein said p-channel type thin film transistor is complementarily connected to said n-channel type thin film transistor.

42. A decoder driver comprising an n-channel type thin film transistor and a p-channel type thin film transistor, each comprising:
   a semiconductor film formed over a substrate having an insulating surface;
   a pair of source and drain regions in said semiconductor film;
   a channel region in said semiconductor film; and
   a gate insulating film adjacent to said channel region and a gate electrode adjacent to said channel region with said gate insulating film interposed therebetween,
   wherein said n-channel type thin film transistor has at least one lightly doped region between said channel region and at least one of said source and drain regions,
   wherein said p-channel type thin film transistor has no lightly doped region in said semiconductor film, and
   wherein said source and drain regions of said p-channel type thin film transistor contain both phosphorus and boron.

43. A decoder driver according to claim 42 wherein the gate electrode is located over the channel region in each of the n-channel type thin film transistor and the p-channel type thin film transistor.

44. A decoder driver according to claim 42 wherein said p-channel type thin film transistor is complementarily connected to said n-channel type thin film transistor.

45. A semiconductor device according to claim 1 further comprising an anodic oxide film on said gate electrode; and a substantially triangular insulator adjacent to a side surface of said gate electrode, wherein said lightly doped region is provided under said substantially triangular insulator.

46. A semiconductor device according to claim 3 further comprising an anodic oxide film on said gate electrode; and a substantially triangular insulator adjacent to a side surface of said gate electrode, wherein said lightly doped region is provided under said substantially triangular insulator.

47. A semiconductor device according to claim 5 further comprising an anodic oxide film on said gate electrode; and a substantially triangular insulator adjacent to a side surface of said gate electrode, wherein said lightly doped region is provided under said substantially triangular insulator.

48. A semiconductor device according to claim 6 further comprising an anodic oxide film on said gate electrode; and a substantially triangular insulator adjacent to a side surface of said gate electrode, wherein said lightly doped region is provided under said substantially triangular insulator.

49. A semiconductor device according to claim 7 further comprising an anodic oxide film on said gate electrode; and a substantially triangular insulator adjacent to a side surface of said gate electrode, wherein said lightly doped region is provided under said substantially triangular insulator.

50. A semiconductor device according to claim 9 further comprising an anodic oxide film on said gate electrode; and a substantially triangular insulator adjacent to a side surface of said gate electrode, wherein said lightly doped region is provided under said substantially triangular insulator.

51. A semiconductor device according to claim 11 further comprising an anodic oxide film on said gate electrode; and a substantially triangular insulator adjacent to a side surface of said gate electrode, wherein said lightly doped region is provided under said substantially triangular insulator.

52. A semiconductor device according to claim 12 further comprising an anodic oxide film on said gate electrode; and a substantially triangular insulator adjacent to a side surface of said gate electrode, wherein said lightly doped region is provided under said substantially triangular insulator.

53. A semiconductor device according to claim 17 further comprising an anodic oxide film on said gate electrode; and a substantially triangular insulator adjacent to a side surface of said gate electrode, wherein said lightly doped region is provided under said substantially triangular insulator.

54. A semiconductor device according to claim 20 further comprising an anodic oxide film on said gate electrode; and a substantially triangular insulator adjacent to a side surface of said gate electrode, wherein said lightly doped region is provided under said substantially triangular insulator.

55. A semiconductor device according to claim 23 further comprising an anodic oxide film on said gate electrode; and a substantially triangular insulator adjacent to a side surface of said gate electrode, wherein said lightly doped region is provided under said substantially triangular insulator.

56. A semiconductor device according to claim 24 further comprising an anodic oxide film on said gate electrode; and a substantially triangular insulator adjacent to a side surface of said gate electrode, wherein said lightly doped region is provided under said substantially triangular insulator.

57. A semiconductor device according to claim 25 further comprising an anodic oxide film on said gate electrode; and a substantially triangular insulator adjacent to a side surface of said gate electrode, wherein said lightly doped region is provided under said substantially triangular insulator.

58. A semiconductor device according to claim 28 further comprising an anodic oxide film on said gate electrode; and a substantially triangular insulator adjacent to a side surface of said gate electrode, wherein said lightly doped region is provided under said substantially triangular insulator.

59. A semiconductor device according to claim 31 further comprising an anodic oxide film on said gate electrode; and a substantially triangular insulator adjacent to a side surface of said gate electrode, wherein said lightly doped region is provided under said substantially triangular insulator.

60. A semiconductor device according to claim 32 further comprising an anodic oxide film on said gate electrode; and a substantially triangular insulator adjacent to a side surface of said gate electrode, wherein said lightly doped region is provided under said substantially triangular insulator.

61. An input port according to claim 33 further comprising an anodic oxide film on said gate electrode; and a substantially triangular insulator adjacent to a side surface of said gate electrode, wherein said lightly doped region is provided under said substantially triangular insulator.

62. A central processing unit according to claim 36 further comprising an anodic oxide film on said gate electrode; and a substantially triangular insulator adjacent to a side surface of said gate electrode, wherein said lightly doped region is provided under said substantially triangular insulator.

63. A memory circuit according to claim 39 further comprising an anodic oxide film on said gate electrode; and a substantially triangular insulator adjacent to a side surface of said gate electrode, wherein said lightly doped region is provided under said substantially triangular insulator.

64. A decoder driver according to claim 42 further comprising an anodic oxide film on said gate electrode; and a substantially triangular insulator adjacent to a side surface of said gate electrode, wherein said lightly doped region is provided under said substantially triangular insulator.

65. A semiconductor device according to claim 24 wherein said insulating film comprises silicon nitride.

66. A semiconductor device according to claim 32 wherein said insulating film comprises silicon nitride.

* * * * *